(12) United States Patent
Nonaka et al.

(10) Patent No.: US 7,927,697 B2
(45) Date of Patent: Apr. 19, 2011

(54) DOUBLE-SIDED PRESSURE-SENSITIVE ADHESIVE TAPE OR SHEET FOR WIRING CIRCUIT BOARD AND WIRING CIRCUIT BOARD

(75) Inventors: Takahiro Nonaka, Osaka (JP); Miyoko Ikishima, Osaka (JP); Noritsugu Daigaku, Osaka (JP); Masahiro Oura, Osaka (JP); Masahiko Ando, Osaka (JP)

(73) Assignee: Nitto Denko Corporation, Osaka (JP)

( * ) Notice: Subject to any disclaimer, the term of this patent is extended or adjusted under 35 U.S.C. 154(b) by 965 days.

(21) Appl. No.: 11/783,631

(22) Filed: Apr. 11, 2007

(65) Prior Publication Data
US 2007/0237949 A1 Oct. 11, 2007

(30) Foreign Application Priority Data

Apr. 11, 2006 (JP) .............................. P. 2006-108555
Jan. 15, 2007 (JP) .............................. P. 2007-006207

(51) Int. Cl.
*B32B 7/12* (2006.01)
*B32B 27/30* (2006.01)
(52) U.S. Cl. ........ 428/355 AC; 428/355 R; 428/355 EN
(58) Field of Classification Search .................. 428/343, 428/355 R, 355 EN, 355 AC
See application file for complete search history.

(56) References Cited

U.S. PATENT DOCUMENTS 7,229,683 B2 * 6/2007 Fischer et al. ............. 428/293.7
7,635,516 B2 * 12/2009 Arimitsu et al. ............... 428/343

FOREIGN PATENT DOCUMENTS

JP     2001-40301 A    2/2001
JP     2001-240817     9/2001

OTHER PUBLICATIONS

European Search Report dated Jul. 4, 2007.

* cited by examiner

*Primary Examiner* — Thao T. Tran
(74) *Attorney, Agent, or Firm* — Sughrue Mion, PLLC

(57) ABSTRACT

The present invention relates to a double-sided pressure-sensitive adhesive tape or sheet for wiring circuit board, which comprises a pressure-sensitive adhesive layer formed by a pressure-sensitive adhesive composition containing an acrylic polymer and a chain transfer substance, in which the pressure-sensitive adhesive layer has characteristics that a gel fraction in the initial stage is from 40 to 70% by weight, and a difference between a gel fraction (% by weight) of the pressure-sensitive adhesive layer after the following solder reflow step and the gel fraction (% by weight) of the pressure-sensitive adhesive layer in the initial stage is 10 or less. The solder reflow step satisfies the following heat treatment conditions. Surface temperature of the double-sided pressure-sensitive adhesive tape or sheet reaches 175±10° C. within 130 to 180 seconds, the surface temperature reaches 230±10° C. within 200 to 250 seconds, the surface temperature reaches 255±15° C. within 260 to 300 seconds and the solder reflow step finishes within 370 seconds after start of the solder reflow step for the double-sided pressure-sensitive adhesive tape or sheet.

9 Claims, 3 Drawing Sheets

DOUBLE-SIDED PRESSURE-SENSITIVE ADHESIVE TAPE OR SHEET FOR WIRING CIRCUIT BOARD AND WIRING CIRCUIT BOARD

FIELD OF THE INVENTION

The present invention relates to a double-sided pressure-sensitive adhesive tape or sheet for wiring circuit board and a wiring circuit board.

BACKGROUND OF THE INVENTION

In electronic instruments, wiring circuit boards are used and, with regard to the wiring circuit board, a flexible printed circuit board (may be sometimes called "FPC") has been widely used. Usually, wiring circuit boards such as FPC are used in a state of being adhered to a reinforcing plate (such as aluminum plate, stainless steel plate or polyimide plate) and, at that time, a double-sided pressure-sensitive adhesive tape or sheet (double-sided pressure-sensitive adhesive tape or sheet for wiring circuit board) is used. With regard to such a double-sided pressure-sensitive adhesive tape or sheet, a double-sided pressure-sensitive adhesive tape or sheet having a constitution of being formed by adhesive layers only (the so-called "double-sided pressure-sensitive adhesive tape or sheet without substrate") has been widely used in view of the total thickness. However, since the double-sided pressure-sensitive adhesive tape or sheet without substrate has no substrate, it is not suitable for fine perforating process. Moreover, there is a problem in the conventional double-sided pressure-sensitive adhesive tape or sheet that, especially under the conditions of high temperature and high humidity, the cut sides are adhered again (self-adhesion) after being perforated whereby working ability lowers. Further, in the worst case, it sometimes happens that, in detaching the perforated product, a part where an adhesive is deficient is resulted.

Although it has been attempted that, in the adhesive layer, the insoluble matter in solvent is enhanced for preventing the self-adhesion of the cut sides (refer to Patent Document 1), there is a problem that, when the matter which is insoluble in a solvent is enhanced, the adhesive layer is peeled off from the adherend when the part on which repulsive force acts is adhered.

On the other hand, in wiring circuit board such as FPC, there are some cases where a high-temperature step such as a solder reflow step is conducted but, when a part on which a repulsive force is applied is adhered after the solder reflow step, a problem that the adhesive layer is peeled off from the adherend sometimes happens.

Patent Document 1: JP-A-2001-40301

SUMMARY OF THE INVENTION

Accordingly, an object of the present invention is to provide a double-sided pressure-sensitive adhesive tape or sheet for wiring circuit board which has a good adhesive force and can exert an excellent anti-repulsion property even being subjected to a high-temperature step and also to provide a wiring circuit board in which said double-sided pressure-sensitive adhesive tape or sheet for wiring circuit board is used.

Another object of the present invention is to provide a double-sided pressure-sensitive adhesive tape or sheet for wiring circuit board which is able to suppress or prevent the self-adhesion of the cut sides after a cutting process and has an excellent fine processing property and also to provide a wiring circuit board in which said double-sided pressure-sensitive adhesive tape or sheet for wiring circuit board is used.

In order to achieve the above-mentioned objects, the present inventors have carried out intensive investigations and found that, when a double-sided pressure-sensitive adhesive tape or sheet having a pressure-sensitive adhesive layer formed by a pressure-sensitive adhesive composition which contains an acrylic polymer as a base polymer and specific components and which has such characteristics that the gel fraction in the initial stage has a specific value and that the gel fraction after a solder reflow step with specific heat treatment conditions has a specific value with respect to the gel fraction in the initial stage is used as the double-sided pressure-sensitive adhesive tape or sheet to be used for wiring circuit board, a good adhesive force to the wiring circuit board and reinforcing plate can be obtained, an excellent anti-repulsion property can be achieved even being subjected to a high-temperature step by a solder reflow step and a good adhesive force can be retained even when used to the part where repulsion takes place.

Figure 1:
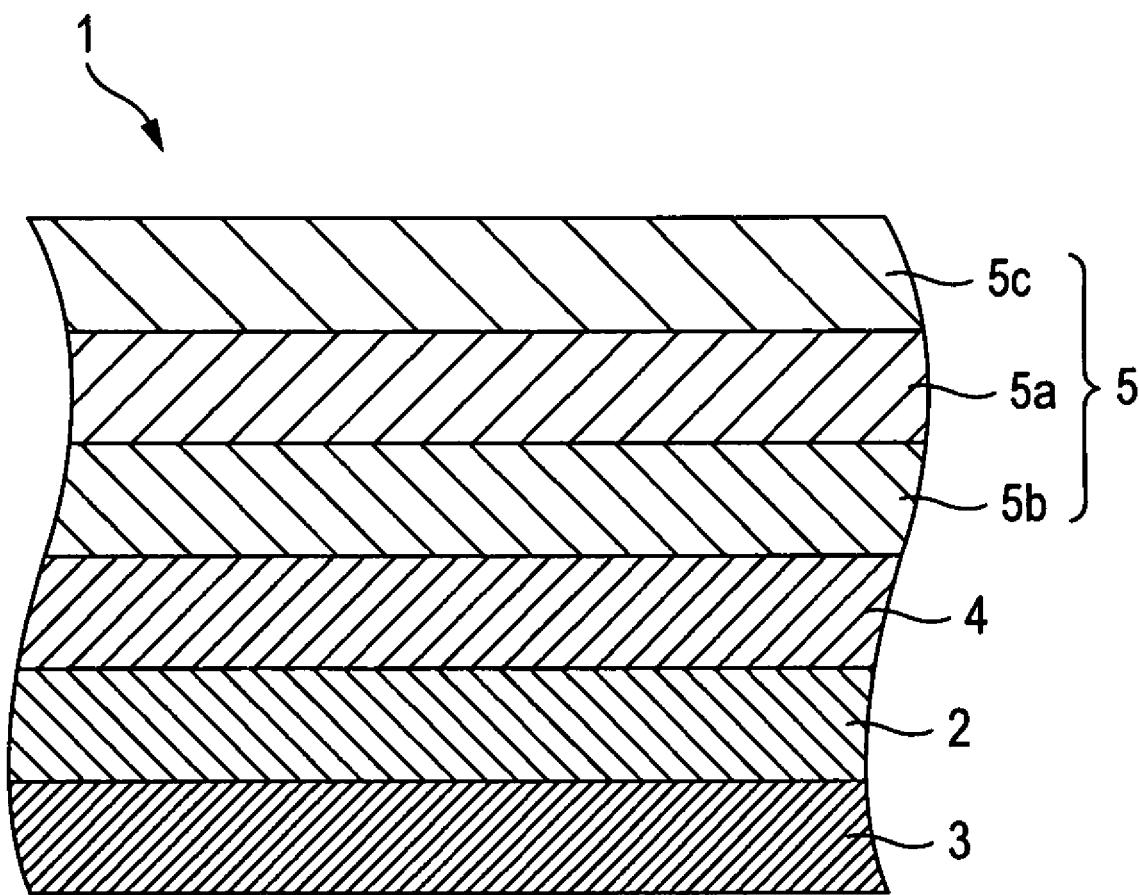
FIG. 1 is a rough cross-sectional view which partly shows an example of the double-sided pressure-sensitive adhesive tape or sheet for wiring circuit board according to the present invention.

| | Description of Symbols |
|---|---|
| 1 | double-sided pressure-sensitive adhesive tape or sheet for wiring circuit board |
| 2 | substrate |
| 3 | pressure-sensitive adhesive layer |
| 4 | pressure-sensitive adhesive layer |
| 5 | release liner |
| 5a | substrate in the release liner 5 |
| 5b | release treating agent layer |
| 5c | release treating agent layer |
| 6 | double-sided pressure-sensitive adhesive tape or sheet |
| 7 | lining material (the model FPC having the characteristic as shown in Table 2) |
| 8 | adherend |
| 8a | surface of a polyimide plate |
| 8b | surface of an aluminum plate |
| A | area where floating is observed |

DETAILED DESCRIPTION OF THE INVENTION

Namely, the present invention relates to the followings.

(1) A double-sided pressure-sensitive adhesive tape or sheet for wiring circuit board, which comprises a pressure-sensitive adhesive layer formed by a pressure-sensitive adhesive composition containing an acrylic polymer and a chain transfer substance, wherein said pressure-sensitive adhesive layer has characteristics in which a gel fraction in the initial stage is from 40 to 70% by weight, and a difference between a gel fraction (% by weight) after a solder reflow step and the gel fraction (% by weight) in the initial stage is 10 or less, said solder reflow step satisfying the following heat treatment conditions:

(a) a surface temperature of said pressure-sensitive adhesive tape or sheet reaches 175±10° C. within 130 to 180 seconds after start of the solder reflow step for said pressure-sensitive adhesive tape or sheet;

(b) the surface temperature of said pressure-sensitive adhesive tape or sheet reaches 230±10° C. within 200 to 250 seconds after start of the solder reflow step for said pressure-sensitive adhesive tape or sheet;

(c) the surface temperature of said pressure-sensitive adhesive tape or sheet reaches 255±15° C. within 260 to 300 seconds after start of the solder reflow step for said pressure-sensitive adhesive tape or sheet; and (d) the solder reflow step finishes within 370 seconds after start of the solder reflow step for said pressure-sensitive adhesive tape or sheet.

(2) The double-sided pressure-sensitive adhesive tape or sheet according to (1), wherein the chain transfer substance is a compound having a hydroxyl group and/or a compound having a thiol group.

(3) The double-sided pressure-sensitive adhesive tape or sheet according to (1), wherein the chain transfer substance is a tackifier resin containing a phenolic hydroxyl group or a chain transfer agent.

(4) The double-sided pressure-sensitive adhesive tape or sheet according to (3), wherein the tackfier resin containing a phenolic hydroxyl group is at least one member selected from the group consisting of a phenol-modified terpene-type tackifier resin, a phenol-modified rosin-type tackifier resin and a phenol-type tackifier resin.

(5) The double-sided pressure-sensitive adhesive tape or sheet according to (3), wherein the pressure-sensitive adhesive composition includes a low-molecular weight polymer composition containing a low-molecular weight polymer component and a chain transfer agent for adjusting the molecular weight of the low-molecular weight polymer component, whereby the chain transfer agent is contained in the pressure-sensitive adhesive composition.

(6) The double-sided pressure-sensitive adhesive tape or sheet according to (5), wherein the low-molecular weight polymer component contains, as a main monomer component, an ethylenic unsaturated monomer having a cyclic structure in the molecule thereof.

(7) The double-sided pressure-sensitive adhesive tape or sheet according to (6), wherein the low-molecular weight polymer component contains, as monomer components, 90 to 99 parts by weight of cyclohexyl methacrylate and 10 to 1 part by weight of acrylic acid.

(8) The double-sided pressure-sensitive adhesive tape or sheet according to (3), wherein the pressure-sensitive adhesive composition contains, as the chain transfer substance, the tackifier resin containing a phenolic hydroxyl group in a proportion of from 5 to 45 parts by weight with respect to 100 parts by weight of the acrylic polymer.

(9) The double-sided pressure-sensitive adhesive tape or sheet according to (5), wherein the pressure-sensitive adhesive composition contains, as the chain transfer substance, the low-molecular weight polymer composition containing the chain transfer agent so that the low-molecular weight polymer component is contained in a proportion of from 5 to 45 parts by weight with respect to 100 parts by weight of the acrylic polymer.

(10) A double-sided pressure-sensitive adhesive tape or sheet, which comprises:

a substrate; and a plurality of pressure-sensitive adhesive layers disposed on both sides of the substrate, at least one of said plurality of pressure-sensitive adhesive layers being a pressure-sensitive adhesive layer formed by a pressure-sensitive adhesive composition containing an acrylic polymer and a chain transfer substance, wherein said pressure-sensitive adhesive layer has characteristics in which a gel fraction in the initial stage is from 40 to 70% by weight, and a difference between a gel fraction (% by weight) after a solder reflow step and the gel fraction (% by weight) in the initial stage is 10 or less, said solder reflow step satisfying the following heat treatment conditions:

(a) a surface temperature of said pressure-sensitive adhesive tape or sheet reaches 175±10° C. within 130 to 180 seconds after start of the solder reflow step for said pressure-sensitive adhesive tape or sheet;

(b) the surface temperature of said pressure-sensitive adhesive tape or sheet reaches 230±10° C. within 200 to 250 seconds after start of the solder reflow step for said pressure-sensitive adhesive tape or sheet;

(c) the surface temperature of said pressure-sensitive adhesive tape or sheet reaches 255±15° C. within 260 to 300 seconds after start of the solder reflow step for said pressure-sensitive adhesive tape or sheet; and (d) the solder reflow step finishes within 370 seconds after start of the solder reflow step for said pressure-sensitive adhesive tape or sheet.

(11) The double-sided pressure-sensitive adhesive tape or sheet according to (10), wherein the substrate comprises nonwoven fabric.

(12) The double-sided pressure-sensitive adhesive tape or sheet according to (1), which has a thickness from one pressure-sensitive adhesive surface to the other pressure-sensitive adhesive surface of from 20 to 70 μm.

(13) The double-sided pressure-sensitive adhesive tape or sheet according to (10), which has a thickness from one pressure-sensitive adhesive surface to the other pressure-sensitive adhesive surface of from 20 to 70 μm.

(14) A wiring circuit board comprising an electric insulator layer and an electric conductor layer disposed on the electric insulator layer so as to form a predetermined circuit pattern, wherein the double-sided pressure-sensitive adhesive tape or sheet according to (1) is adhered on the back side of the wiring circuit board.

(15) A wiring circuit board comprising an electric insulator layer and an electric conductor layer disposed on the electric insulator layer so as to form a predetermined circuit pattern, wherein the double-sided pressure-sensitive adhesive tape or sheet according to (10) is adhered on the back side of the wiring circuit board.

With regard to the chain transfer substance, a compound having a hydroxyl group and/or a compound having a thiol group may be used and a tackifier resin containing a phenolic hydroxyl group or a chain transfer agent may be used advantageously.

With regard to the tackifier resin containing a phenolic hydroxyl group in the chain transfer substance, at least one member selected from the group consisting of a phenol-modified terpene-type tackifier resin, a phenol-modified rosin-type tackifier resin and a phenol-type tackifier resin is advantageous.

According to the present invention, when a low-molecular weight polymer composition containing a low-molecular weight polymer component and a chain transfer agent for adjusting the molecular weight of the low-molecular weight polymer component is used, the chain transfer agent as a chain transfer substance may be contained in the pressure-sensitive adhesive composition. In this case, the low-molecular weight polymer component is preferably a low-molecular weight polymer component in which an ethylenic unsaturated monomer having a cyclic structure in the molecule thereof is a main monomer component is advantageous and, particularly, a low-molecular weight polymer component containing 90 to 99 parts by weight of cyclohexyl methacrylate and 10 to 1 parts by weight of acrylic acid as monomer components may be advantageously used.

According to the present invention, when the chain transfer substance is a tackifier resin containing a phenolic hydroxyl group, it is preferred that the pressure-sensitive adhesive composition contains the tackifier resin containing a phenolic hydroxyl group as the chain transfer substance in a proportion of from 5 to 45 parts by weight with respect to 100 parts by weight of the acrylic polymer. Further, when the chain transfer substance is a chain transfer agent contained in a low-molecular weight polymer composition, it is preferred that the pressure-sensitive adhesive composition contains the low-molecular weight polymer composition containing the chain transfer agent as the chain transfer substance so that the low-molecular weight polymer component is contained in a proportion of from 5 to 45 parts by weight with respect to 100 parts by weight of the acrylic polymer.

It is preferred that the double-sided pressure-sensitive adhesive tape or sheet for wiring circuit board according to the present invention has such a structure that pressure-sensitive adhesive layers are formed on both sides of a substrate. With regard to the above substrate, nonwoven fabric is advantageous. With regard to the double-sided pressure-sensitive adhesive tape or sheet for wiring circuit board, it is preferred that the thickness from one pressure-sensitive adhesive surface to the other pressure-sensitive adhesive surface is from 20 to 70 μm.

Since the double-sided pressure-sensitive adhesive tape or sheet for wiring circuit board according to the present invention has the above-mentioned constitution, it has a good adhesive force and, even after being subjected to a high-temperature step, it can exert an excellent anti-repulsion property. Further, it is possible to suppress or prevent the self-adhesion of the cut sides after a cutting process and its fine processing property is also excellent.

Hereinafter, embodiments of the present invention will be illustrated in more detail by referring to the drawings according to the necessity. Incidentally, the same material, site, etc. may be assigned with the same reference numerals/letters.

As shown in FIG. 1, the double-sided pressure-sensitive adhesive tape or sheet for wiring circuit board according to the present invention at least has a pressure-sensitive adhesive layer which is formed by the following pressure-sensitive adhesive composition and which has the following characteristics.

Adhesive composition: An adhesive composition containing an acrylic polymer as a main component and a chain transfer substance Characteristics: The characteristics that the gel fraction in the initial stage is 40 to 70% by weight and that the difference between the gel fraction (% by weight) after a solder reflow step satisfying the following heat treatment conditions and the gel fraction (% by weight) in the initial stage is 10 or less (Heat Treatment Conditions in a Solder Reflow Step)

(a) The surface temperature of the double-sided pressure-sensitive adhesive tape or sheet (or the pressure-sensitive adhesive layer) reaches 175±10° C. (165 to 185° C.) within 130 to 180 seconds after start of the solder reflow step for the double-sided pressure-sensitive adhesive tape or sheet (or the pressure-sensitive adhesive layer).

(b) The surface temperature of the double-sided pressure-sensitive adhesive tape or sheet (or the pressure-sensitive adhesive layer) reaches 230±10° C. (220 to 240° C.) within 200 to 250 seconds after start of the solder reflow step for the double-sided pressure-sensitive adhesive tape or sheet (or the pressure-sensitive adhesive layer).

(c) The surface temperature of the double-sided pressure-sensitive adhesive tape or sheet (or the pressure-sensitive adhesive layer) reaches 255±15° C. (240 to 270° C.) within 260 to 300 seconds after start of the solder reflow step for the double-sided pressure-sensitive adhesive tape or sheet (or the pressure-sensitive adhesive layer).

(d) The solder reflow step finishes within 370 seconds after start of the solder reflow step for the double-sided pressure-sensitive adhesive tape or sheet (or the pressure-sensitive adhesive layer).

Since the pressure-sensitive adhesive layer is formed by a pressure-sensitive adhesive composition containing an acrylic polymer as a main component, it has a good adhesive property. In addition, since the pressure-sensitive adhesive layer contains a chain transfer substance, the chain transfer substance captures a radical component so that the radical component can be effectively inactivated even when a radical component is generated in the adhesive layer by being subjected, for example, to a high-temperature step. Therefore, a rise in gel fraction in the pressure-sensitive adhesive layer can be effectively suppressed or prevented.

Further, in the pressure-sensitive adhesive layer, the gel fraction in the initial stage is 40 to 70% by weight and the difference between the gel fraction (% by weight) after the reflow step and the gel fraction (% by weight) in the initial stage is 10 or less (or, in other words, the gel fraction (% by weight) after the reflow step is [gel fraction (% by weight) in the initial stage+10] or less) whereby, even after a high-temperature step such as a solder reflow step, a good gel fraction is retained and an excellent anti-repulsion property can be effectively exerted.

In the present invention, the gel fraction (rate of the matter which is insoluble in a solvent) of the pressure-sensitive adhesive layer in the initial stage is preferably 50 to 70% by weight and, particularly preferably, 55 to 65% by weight. When the gel fraction of the pressure-sensitive adhesive layer in the initial stage is less than 40% by weight, a retaining characteristic of the pressure-sensitive adhesive layer is low, while, when it is more than 70% by weight, a repulsive characteristic of the pressure-sensitive adhesive layer is low. Incidentally, the gel fraction of the pressure-sensitive adhesive layer in the initial stage means a gel fraction of the pressure-sensitive adhesive layer in the double-sided pressure-sensitive tape or sheet (the double-sided pressure-sensitive adhesive tape or sheet for wiring circuit board) when used for a wiring circuit board and, usually, it may be a gel fraction before a solder reflow step satisfying the above-mentioned heat treatment conditions (a gel fraction before being subjected to a solder reflow step satisfying the above-mentioned heat treatment conditions).

In the present invention, the difference (sometimes called "gel fraction difference") between the gel fraction (% by weight) after a reflow step and the gel fraction (% by weight) in the initial stage is preferably 7 or less, more preferably 5 or less, still more preferably 3 or less (particularly, 1 or less) and, particularly preferably, 0. Needless to say, the lower limit of the gel fraction different is usually 0 (or, in other words, the gel fraction (% by weight) at the reflow step and the gel fraction (% by weight) at the initial stage are the same value).

In the present invention, the gel fraction is a value calculated by the "Method for measurement of gel fraction" which will be mentioned below.

Method for Measurement of Gel Fraction

After a pressure-sensitive adhesive composition is applied on a release liner, it is dried or hardened to form a pressure-sensitive adhesive layer. About 0.1 g of the pressure-sensitive adhesive layer or the pressure-sensitive adhesive layer after a solder reflow step satisfying the above-mentioned heat treatment conditions is packed with a tetrafluoroethylene sheet having a thickness of 0.2 μm (trade name: "NTF 1122"; manufactured by Nitto Denko Corporation) and tied up with a kite string and the weight at that time is measured and used as a weight before dipping. Incidentally, the weight before dipping is a total weight covering the weights of the pressure-sensitive adhesive layer, the tetrafluoroethylene sheet and the kite string. Further, the weight of the tetrafluoroethylene sheet and the kite string is measured and the weight is defined as a package weight.

After that, the product where the pressure-sensitive adhesive layer is wrapped with the tetrafluoroethylene sheet followed by being bound up with the kite string is placed in a 50-ml container filled with ethyl acetate and allowed to stand at room temperature for one week (seven days). Then, the tetrafluoroethylene sheet is taken out from the container, transferred to a cup made of aluminum and dried in a drier at 130° C. for 2 hours to remove ethyl acetate, then the weight of the sample is measured and the weight is defined as a weight after dipping.

Now a gel fraction is calculated by the following formula.

$$\text{Gel Fraction (\% by weight)} = (A-B)/(C-B) \times 100 \quad (1)$$

(In the formula (1), A is weight after dipping, B is package weight and C is weight before dipping.)

FIG. 1 is a rough cross-sectional view which partly shows an example of the double-sided pressure-sensitive adhesive tape or sheet for wiring circuit board in accordance with the present invention. In FIG. 1, 1 is a double-sided pressure-sensitive adhesive tape or sheet for wiring circuit board, 2 is a substrate, 3 is a pressure-sensitive adhesive layer, 4 is a pressure-sensitive adhesive layer, 5 is a release liner, 5a is a substrate for the release liner 5, 5b is a release treating agent layer and 5c is a release treating agent layer. Both pressure-sensitive adhesive layer 3 and pressure-sensitive adhesive layer 4 are formed by a pressure-sensitive adhesive composition containing an acrylic polymer as a main component and a chain transfer substance and have such characteristics that gel fraction in the initial stage is 40 to 70% by weight and the gel fraction difference is 10 or less.

In the double-sided pressure-sensitive adhesive tape or sheet 1 for wiring circuit board shown in FIG. 1, a pressure-sensitive adhesive layer 3 and a pressure-sensitive adhesive layer 4 are formed on respective sides of the substrate 2, and the surface of the pressure-sensitive adhesive layer 3 and the surface of the pressure-sensitive adhesive layer 4 are protected by a release liner 5 with being wounded into a roll.

Figure 2:
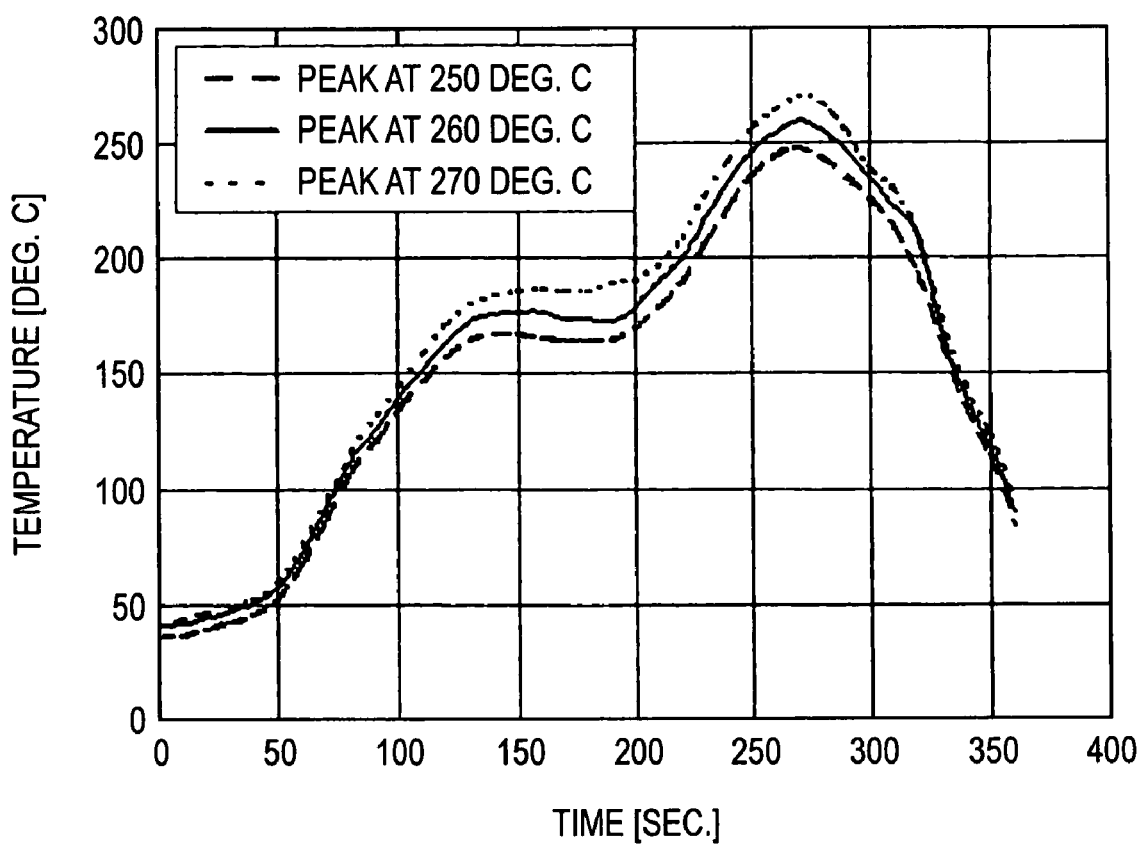
FIG. 2 is a graph which shows an example of temperature profile of heating treatment condition in a solder reflow step.

With regard to a solder reflow step satisfying the above-mentioned heat treatment conditions in the present invention, there is no particular limitation so long as it is a solder reflow step satisfying the above-mentioned heat treatment conditions and an example thereof is a solder reflow step satisfying the heat treatment conditions with a temperature profile shown by the graph in FIG. 2. In FIG. 2, an ordinate is temperature (° C., degree Celsius) and an abscissa is time (second(s)). In FIG. 2, temperature profiles of three examples where the peak temperature or the highest temperature is about 250° C., about 260° C. and about 270° C. are shown. In the present invention, the surface temperature of the double-sided pressure-sensitive adhesive tape or sheet (or the pressure-sensitive adhesive layer) in the solder reflow step is continuously measured by a temperature sensor after a thermocouple is fixed on the surface of the double-sided pressure-sensitive adhesive tape or sheet (or pressure-sensitive adhesive layer) using a pressure-sensitive adhesive tape (a heat-resistant pressure-sensitive adhesive tape including a polyimide film as a substrate). Incidentally, in the solder reflow step, the following solder reflow instrument is used while, in the measurement of the surface temperature, the following temperature sensor is used.

Solder reflow instrument: Conveyer-type heating apparatus by far-infrared and hot wind (manufactured by Noritake Co., Ltd.)

Temperature sensor: Keyence NR-250 (manufactured by Keyence Corporation)

Chain Transfer Substance

As the chain transfer substance contained in the pressure-sensitive adhesive composition for the formation of a pressure-sensitive adhesive layer in the double-sided pressure-sensitive adhesive tape or sheet for wiring circuit board in accordance with the present invention, it is possible to use a substance (a compound) which is able to achieve a chain transfer property capable of capturing a radical and to subject it to chain transfer and examples thereof include a compound containing a hydroxyl group and a compound containing a thiol group (a mercapto group). The chain transfer substance may be used solely or two or more thereof may be used in combination. The hydroxyl group may be a hydroxyl group which is directly bonded to carbon atom constituting a chain such as in an alkyl group or to a carbon atom constituting a non-aromatic ring such as in a cycloalkyl group or may be a hydroxyl group (a phenolic hydroxyl group) which is directly bonded to a carbon atom constituting an aromatic ring such as in an aryl group. Like the hydroxyl group, the thiol group may be a thiol group which is directly bonded to carbon atom constituting a chain such as in an alkyl group or to a carbon atom constituting a non-aromatic ring such as in a cycloalkyl group or may be a thiol group (a thiophenolic thiol group) which is directly bonded to a carbon atom constituting an aromatic ring such as in an aryl group.

As the chain transfer substance in the present invention, a tackifier resin (tackifier) having a chain transfer property or a chain transfer agent may be advantageously used.

(Tackifier Resin Having a Chain Transfer Property)

As mentioned above, it is possible in the present invention to use a tackifier resin having a chain transfer property (it may be sometimes called "tackifier resin having chain transfer property") as a chain transfer substance. Accordingly, a tackifier resin used for imparting an adhesive property to a pressure-sensitive adhesive layer or a pressure-sensitive adhesive composition may be used as a chain transfer substance for imparting a chain transfer property to the pressure-sensitive adhesive layer or the pressure-sensitive adhesive composition. When a tackifier resin having chain transfer property is used as a chain transfer substance, a chain transfer property can be imparted to a pressure-sensitive adhesive composition or a pressure-sensitive adhesive layer together with an adhesive property. Accordingly, it is not necessary to separately use a chain transfer substance with an object of only imparting a chain transfer property to a pressure-sensitive adhesive layer or a pressure-sensitive adhesive composition whereby there is no risk of giving a bad affection to characteristics of the pressure-sensitive adhesive layer or the pressure-sensitive adhesive composition.

Further, when a tackifier resin is used as a chain transfer substance, a tackifier resin is contained in a pressure-sensitive adhesive layer whereby it is possible to improve the adhesive property and, therefore, the pressure-sensitive adhesive layer can exert an excellent anti-repulsion property due to the above viewpoint as well.

As a tackifier resin having a chain transfer property, it is possible to use a tackifier resin having a hydroxyl group and, particularly, a tackifier resin containing a phenolic hydroxyl group (an aromatic ring containing a hydroxyl group) (it may be sometimes called "phenolic hydroxyl group-containing tackifier resin") may be advantageously used. As the phenolic hydroxyl group-containing tackifier resin, a phenol-modified terpene-type tackifier resin (tackifier resin of terpene phenol type), a phenol-modified rosin-type tackifier resin (tackifier resin of rosin phenol type) and a phenol-type tackifier resin are preferable. The tackifier resin having a chain transfer property may be used solely or two or more thereof may be used in combination.

In the tackifier resin containing a phenolic hydroxyl group, examples of the phenol-modified terpene-type tackifier resin include phenol-modified terpene-type resins (terpene phenol-type resins) where various kinds of terpene-type resins (such as an $\alpha$-pinene polymer, a $\beta$-pinene polymer and a dipentene polymer) are modified by phenol.

Examples of the phenol-modified rosin-type tackifier resin include phenol-modified rosin-type resins (rosin-modified phenol resins) where phenol is added to various kinds of rosins (such as non-modified rosin, modified rosin and various kinds of rosin derivatives) using an acid catalyst followed by subjecting to a thermal polymerization so that said various kinds of rosins are subjected to modification with phenol.

Further, examples of the phenol-type tackifier resin include condensates of various kinds of phenols such as phenol, resorcinol, cresols (including m-cresol and p-cresol), xylenols (including 3,5-xylenol) and alkylphenols including p-isopropylphenol, p-tert-butylphenol, p-amylphenol, p-octylphenol, p-nonylphenol and p-dodecylphenol (particularly, p-alkylphenols) with formaldehyde (such as alkylphenol resin, phenol formaldehyde resin and xylene formaldehyde resin) as well as resol where the above-mentioned phenols are subjected to an addition polymerization with formaldehyde using an alkali catalyst, novolak where the above-mentioned phenols are subjected to a condensation reaction with formaldehyde using an acid catalyst, etc. Although the number of carbon atom(s) of the alkyl group in the alkylphenols is not particularly limited, it may be appropriately selected from the range of 1 to 18. Preferred examples of the phenol-type tackifier resin include alkylphenol resin and xylene formaldehyde resin and, among them, alkylphenol resin is particularly preferred.

With regard to a tackifier resin having chain transfer property such as a phenolic hydroxyl group-containing tackifier resin, it is advantageous to use a phenolic hydroxyl group-containing tackifier resin which has a softening point of not lower than 80° C. (particularly, not lower than 100° C.) in view of heat resistance, etc.

Although there is no particular limitation for the amount of the tackifier resin having chain transfer property, it may be appropriately selected, for example, from the range of from 5 to 45% by weight with respect to the acrylic polymer in the pressure-sensitive adhesive composition (5 to 45 parts by weight with respect to 100 parts by weight of the acrylic polymer), preferably 10 to 40% by weight and, more preferably, 20 to 40% by weight. When the amount of the chain transfer tackifier resin with respect to the acrylic polymer is less than 5% by weight, a preventive effect for a rise of insoluble matters in a solvent after a solder reflow step lowers while, when it is more than 45% by weight, tacking property of the pressure-sensitive adhesive composition lowers whereby adhesive property or tacky property lowers.

Chain Transfer Agent

In the present invention, it is also possible to use a chain transfer agent as mentioned above. With regard to the chain transfer agent, although it is possible to introduce a chain transfer agent into a pressure-sensitive adhesive composition by addition of the chain transfer agent to the pressure-sensitive adhesive composition, it is preferred to introduce a chain transfer agent into a pressure-sensitive adhesive composition by such a means that a low-molecular weight polymer composition containing a low-molecular weight polymer component (a polymer component having a low molecular weight) and a chain transfer agent for adjusting the molecular weight of the low-molecular weight polymer component is added to the pressure-sensitive adhesive composition. Accordingly, a chain transfer agent used for preparing a low-molecular weight polymer component (in other words, a chain transfer agent in a low-molecular weight polymer composition containing a low-molecular weight polymer component and a chain transfer agent for adjusting the molecular weight of the low-molecular weight polymer component) may be used as a chain transfer substance for imparting a chain transfer property to a pressure-sensitive adhesive layer or a pressure-sensitive adhesive composition. When the low-molecular weight polymer composition containing a chain transfer agent is used as a chain transfer substance, it is now possible to impart a chain transfer property together with the characteristic of the low-molecular weight polymer component. Accordingly, it is not necessary to separately use a chain transfer substance with an object of only imparting a chain transfer property to a pressure-sensitive adhesive layer or a pressure-sensitive adhesive composition whereby there is no risk of giving a bad affection to characteristics of the pressure-sensitive adhesive layer or the pressure-sensitive adhesive composition.

Further, when a chain transfer agent for preparing a low-molecular weight polymer component is used as a chain transfer substance, a low-molecular weight polymer component is contained in a pressure-sensitive adhesive layer whereby it is possible to improve the adhesive property and, therefore, the pressure-sensitive adhesive layer can exert an excellent anti-repulsion property due to the above viewpoint as well.

The chain transfer agent may be used by appropriately selecting from the conventional chain transfer agents and a chain transfer agent having a hydroxyl group (it will be sometimes called "hydroxyl group-containing chain transfer agent") and a chain transfer agent having a thiol group (it will be sometimes called "thiol group-containing chain transfer agent") may be appropriately used. Specific examples of the chain transfer agent include a hydroxyl group-containing chain transfer agent such as benzyl alcohol, $\alpha$-methylbenzyl alcohol and hydroquinone; and a thiol group-containing chain transfer agent such as alkyl mercaptan (including octyl mercaptan, lauryl mercaptan and stearyl mercaptan), benzyl mercaptan, glycidyl mercaptan, thioglycolic acid (mercaptoacetic acid), 2-ethylhexyl thioglycolate, octyl thioglycolate, methoxybutyl thioglycolate, 3-mercaptopropionic acid, octyl mercaptopropionate, methoxybutyl mercaptopropionate, 2-mercaptoethanol, 3-mercapto-1,2-propanediol, 2,3-dimercapto-1-propanol and thioglycerol.

It is also possible to use a chain transfer agent having no hydroxyl group or thiol group (such as an α-methylstyrene dimer) as a chain transfer agent. A chain transfer may be used solely or two or more thereof may be used in combination.

When a chain transfer agent for adjustment of molecular weight of a low-molecular weight polymer in a low-molecular weight polymer composition is used as a chain transfer agent, there is no particular limitation for the low-molecular weight component and it may be appropriately selected from various kinds of low-molecular weight polymer components. Although there is no particular limitation for weight-average molecular weight of the low-molecular weight component, it is preferably 1,000 to 10,000 and, more preferably, 3,000 to 6,000. When the weight-average molecular weight of the low-molecular weight polymer component is less than 1,000, anti-repulsion property and cohesive force are lowered while, when it is more than 10,000, its compatibility with acrylic polymer as the main component of the pressure-sensitive adhesive composition is lowered whereby anti-repulsion property and cohesive force are lowered.

The weight-average molecular weight of the low-molecular weight polymer component may be controlled by the type and the amount of polymerization initiator and chain transfer agent, temperature and time for the polymerization, concentration of the monomer, dropping speed of the monomer, etc.

In the present invention, the weight-average molecular weight of the low-molecular weight polymer was measured under the following measuring conditions.

Name of the apparatus used: "HLC-8120 GPC" manufactured by Tosho Corporation

Column: "TSK gel Super HZM-H/HZ4000/HZ3000/HZ2000" (manufactured by Tosoh Corporation)

Inlet pressure: 7.2 MPa

Column size: each 6.0 mm ø×15 cm; 60 cm in total

Column temperature: 40° C.

Eluting liquid: tetrahydrofuran (THF)

Flow rate: flowing speed 0.6 mL/min

Sample concentration: 0.1% by weight (a solution in tetrahydrofuran)

Infusing amount of sample: 20 μL

Detector: differential refractometer (RI)

Standard sample: polystyrene (PS)

Data processing apparatus: "GPC-8020" manufactured by Tosoh Corporation

The low-molecular weight polymer component may be used solely or two or more thereof may be used in combination.

The low-molecular weight polymer component is not particularly limited but may be appropriately selected from low-molecular weight polymer components containing various kinds of ethylenic unsaturated monomers as monomer components. As the low-molecular weight polymer component, it is advantageous in view of anti-repulsion property to use an ethylenic unsaturated monomer having a cyclic structure in the molecule thereof (it will be sometime called "ring-containing ethylenic unsaturated monomer") as a main monomer component.

With regard to a ring in the ring-containing ethylenic unsaturated monomer, any of aromatic ring and non-aromatic ring may be used and non-aromatic ring is preferred. Examples of the aromatic ring include an aromatic hydrocarbon ring (such as a benzene ring and a fused carbon ring such as in naphthalene) and various kinds of aromatic hetero rings. Examples of the non-aromatic ring include a non-aromatic alicyclic ring (a cycloalkane ring such as a cyclopentane ring, a cyclohexane ring, a cycloheptane ring and a cyclooctane ring; a cycloalkene ring such as a cyclohexene ring), and a non-aromatic cross-linked ring (such as a bicyclic hydrocarbon ring in pinane, pinene, bornane, and norbornene; a tricyclic hydrocarbon ring in adamantine; a cross-linked hydrocarbon ring such as a tetracyclic hydrocarbon ring).

As the ring-containing ethylenic unsaturated monomer, there may advantageously used an ethylenic unsaturated monomer having a cyclic structure in the molecule thereof and having a glass transition temperature (Tg) of from 60 to 190° C. when it is formed into a homopolymer (it will be sometimes called "a ring-containing ethylenic unsaturated monomer having Tg of from 60 to 190° C."). Here, the glass transition temperature (Tg) with regard to the ring-containing ethylenic unsaturated monomer having Tg of from 60 to 190° C. is a value obtained by the following "Method for measurement of Tg".

Method for Measurement of Tg 100 parts by weight of a monomer component (i.e., a ring-containing ethylenic unsaturated monomer having Tg of from 60 to 190° C.), 0.2 part by weight of azobisisobutyronitrile and 200 parts by weight of ethyl acetate as a polymerization solvent were placed into a reactor equipped with thermometer, stirrer, nitrogen-introducing tube and reflux condenser and stirred for 1 hour together with introduction of nitrogen gas. After oxygen in the polymer system is removed, temperature is raised to 63° C. and reaction is carried out for 10 hours. After that, temperature is lowered down to room temperature to give a homopolymer solution in which solid concentration is 33% by weight. After that, the homopolymer solution is applied by casting on a release liner and dried to prepare a test sample (a homopolymer in a sheet form) of about 2 mm thickness. The test sample is punched into a disk of 7.9 mm diameter and sandwiched between parallel plates, viscoelasticity is measured using a viscoelasticity tester (name of the apparatus: "ARES" manufactured by Leometrix) together with applying 1 Hz of shear strain at the temperature range of from −70° C. to 150° C. at a temperature-rising rate of 5° C./minute under a shearing mode, then a maximum temperature of a loss tangent (tan δ) is determined and the maximum temperature of said loss tangent is defined as a glass transition temperature (Tg).

Specific examples of the ring-containing ethylenic unsaturated monomer include non-aromatic ring-containing (meth)acrylate such as cycloalkyl(meth)acrylate (e.g., cyclohexyl(meth)acrylate) and isobornyl(meth)acrylate; aromatic ring-containing (meth)acrylate such as aryl (meth)acrylate (e.g., phenyl(meth)acrylate), aryloxyalkyl (meth)acrylate (e.g., phenoxyethyl(meth)acrylate) and arylalkyl(meth)acrylate (e.g., benzyl(meth)acrylate); and styrene-type monomer such as styrene and α-methylstyrene. As the ring-containing ethylenic unsaturated monomer having Tg of from 60 to 190° C., the monomer in which the glass transition temperature is not lower than 60° C. (preferably, 60 to 190° C. and, more preferably, 63 to 180° C.) is appropriately selected from those specifically exemplified hereinabove and is used. Thus, it is possible to use a substance where the glass transition temperature (Tg) of a homopolymer formed by the above-mentioned ring-containing ethylenic unsaturated monomer is not lower than 60° C. (preferably, 60 to 190° C. and, more preferably, 63 to 180° C.)

As the ring-containing ethylenic unsaturated monomer (particularly, a ring-containing ethylenic unsaturated monomer having Tg of from 60 to 190° C.) in the present invention, a (meth)acrylate having a non-aromatic ring such as cyclohexyl methacrylate and isobornyl(meth)acrylate is preferred and, among them, cyclohexyl methacrylate is may be advantageously used.

In the low-molecular weight polymer component, a ring-containing ethylenic unsaturated monomer as a main monomer component may be used solely or two or more thereof may be used in combination.

In the low-molecular weight polymer component, a ring-containing ethylenic unsaturated monomer is used as a main monomer component and, therefore, its amount with respect to the total monomer components is important to be 50% by weight or more, preferably 80% by weight or more, more preferably 90% by weight or more and, particularly preferably, 90 to 99% by weight. When the amount of the ring-containing ethylenic unsaturated monomer is less than 50% by weight with respect to the total amount of the monomer components, anti-repulsion property and cohesive force lower are lowered.

In the low-molecular weight polymer component containing the ring-containing ethylenic unsaturated monomer as a main monomer component, a monomer component (a copolymerizing monomer) capable of being copolymerized with the ring-containing ethylenic unsaturated monomer may be used together according to the necessity. The proportion of such a copolymerizing monomer may be appropriately selected depending upon the type of the monomer component within a range of less than 50% by weight with respect to the total amount of monomer components and, for achieving a good adhesive property, the use amount is in such an extent that the glass transition temperature of the low-molecular weight polymer component becomes not higher than 60° C. (preferably, 65 to 180° C.). Incidentally, when the glass transition temperature of the low-molecular weight polymer component is lower than 60° C., anti-repulsion property and cohesive force are lowered.

To be more specific, the proportion of the copolymerizing monomer with respect to the total amount of the monomer components is preferably 20% by weight or less, more preferably 10% by weight or less and, particularly preferably, 10 to 1% by weight.

Such a copolymerizing monomer may be used solely or two or more thereof may be used in combination.

Examples of the copolymerizing monomer which may be copolymerized with a ring-containing ethylenic unsaturated monomer in the low-molecular weight polymer component include an alkyl(meth)acrylate such as a $C_{1-20}$ alkyl (meth)acrylate; a carboxyl group-containing monomer such as (meth)acrylic acid and maleic acid or an acid anhydride thereof; a hydroxyl group-containing monomer such as 2-hydroxyethyl (meth)acrylate; an amino group-containing monomer such as N,N-dimethylaminoethyl(meth)acrylate; an epoxy group-containing monomer such as glycidyl (meth)acrylate; a cyano-containing monomer such as acrylonitrile and a methacrylonitrile; a monomer having a nitrogen atom-containing ring such as N-(meth)acryloylmorpholine; a monomer of a vinyl ester type such as vinyl acetate; an olefinic monomer such as ethylene, propylene, isoprene, butadiene and isobutylene; vinyl chloride and vinylidene chloride; an isocyanate group-containing monomer such as 2-(meth)acryloyloxyethyl isocyanate; an alkoxy group-containing monomer such as methoxyethyl(meth)acrylate; a monomer of a vinyl ether type such as methyl vinyl ether and ethyl vinyl ether; and a multifunctional monomer such as 1,6-hexanediol di(meth)acrylate, ethylene glycol di(meth)acrylate, diethylene glycol di(meth)acrylate, triethylene glycol di(meth)acrylate, tetraethylene glycol di(meth)acrylate, (poly)ethylene glycol di(meth)acrylate, propylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, glycerol di(meth)acrylate, epoxy acrylate, polyester acrylate, urethane acrylate, divinylbenzene, butyl di(meth)acrylate and hexyl di(meth)acrylate.

As the copolymerizing monomer which may be copolymerized with a ring-containing ethylenic unsaturated monomer in a low-molecular weight polymer component, a monomer containing a carboxyl group is advantageous and, in view of the heat resistance, acrylic acid may be used particularly advantageously.

Accordingly, as a low-molecular weight polymer component, a low-molecular weight polymer component containing an ethylenic unsaturated monomer having a cyclic structure in the molecule thereof (particularly, cyclohexyl methacrylate) is preferred and a low-molecular weight polymer component containing 90 to 99 parts by weight of cyclohexyl methacrylate and 10 to 1 parts by weight of acrylic acid is particularly advantageous.

A low-molecular weight polymer component can be prepared by a conventional or common polymerization method. To be more specific, examples of the method for polymerization of a low-molecular weight polymer component are a solution polymerization method, an emulsion polymerization method, a bulk polymerization method and a polymerization method by irradiation of ultraviolet ray. Incidentally, in polymerization of a low-molecular weight polymer component, it is important to use a chain transfer agent. Further, in polymerization of a low-molecular weight polymer component, appropriate components depending upon each of the polymerization methods such as polymerization initiator, emulsifier and solvent are able to be appropriately selected from conventional or common ones and used.

There is no particular limitation for the amount of the chain transfer agent used therefor but the amount may be appropriately determined depending, for example, upon the amount of the low-molecular weight polymer component used. With regard to the amount of the low-molecular weight polymer component, it may be appropriately selected from the range of from 5 to 45% by weight (preferably, 10 to 40% by weight and, more preferably, 20 to 40% by weight) with respect to the amount of the acrylic polymer in the pressure-sensitive adhesive composition, same as the amount of the chain transfer tackifier resin. When the amount of the low-molecular weight polymer component with respect to the amount of the acrylic polymer is less than 5% by weight, an effect of preventing a rise in a matter which is insoluble in a solvent after a solder reflow step is lowered while, when it is more than 45% by weight, tacking property of the pressure-sensitive adhesive composition lowers and adhesive property or tackiness are lowered.

The proportion of the chain transfer agent in the low-molecular weight polymer composition may be appropriately determined depending upon the type, the weight-average molecular weight, etc. of the low-molecular weight polymer component and, for example, it may be appropriately selected from the range of from 1 to 20% by weight (preferably 2 to 15% by weight and, more preferably, 2 to 10% by weight) with respect to the total amount of monomer components in the low-molecular weight polymer component.

As above, in the present invention, a chain transfer tackifier resin or a low-molecular weight polymer composition containing a chain transfer agent is used as a chain transfer substance whereby adhesive property of the pressure-sensitive adhesive layer can be enhanced and, also, gel fraction of the pressure-sensitive adhesive layer can be retained in a good gel fraction so that the adhesive property of the pressure-sensitive adhesive layer can be retained in a good state and, as a result, anti-repulsion property is effectively enhanced.

As a chain transfer substance, a chain transfer tackifier resin is more preferred among the above-mentioned ones in view of its better adhesive property and anti-repulsion property.

Acrylic Polymer

An acrylic polymer which is a main component in a pressure-sensitive adhesive composition for the formation of a pressure-sensitive adhesive layer is an acrylic polymer and, therefore, it is possible to use polymer of a (meth)acrylate type containing a (meth)acrylate (acrylate, methacrylate) as a main monomer component. Examples of such a (meth)acrylate include the alkyl(meth)acrylate as shown below, and also, cycloalkyl(meth)acrylate such as cyclohexyl(meth)acrylate and aryl(meth)acrylate such as phenyl(meth)acrylate. As the (meth)acrylate, an alkyl (meth)acrylate may be used advantageously. Thus, as an acrylic polymer, polymer of a (meth) acrylate type containing an alkyl(meth)acrylate as a main monomer component may be advantageously used.

The (meth)acrylate may be used solely or two or more thereof may be used in combination.

Examples of the alkyl(meth)acrylate used as a main monomer component in the acrylic polymer include methyl (meth) acrylate, ethyl(meth)acrylate, propyl (meth)acrylate, isopropyl(meth)acrylate, n-butyl (meth)acrylate, isobutyl(meth) acrylate, sec-butyl (meth)acrylate, tert-butyl(meth)acrylate, pentyl (meth)acrylate, isopentyl(meth)acrylate, neopentyl (meth)acrylate, hexyl(meth)acrylate, heptyl (meth)acrylate, octyl(meth)acrylate, isooctyl (meth)acrylate, 2-ethylhexyl (meth)acrylate, nonyl (meth)acrylate, isononyl(meth)acrylate, decyl (meth)acrylate, isodecyl(meth)acrylate, undecyl (meth)acrylate, dodecyl(meth)acrylate, tridecyl (meth)acrylate, tetradecyl(meth)acrylate, pentadecyl (meth)acrylate, hexadecyl(meth)acrylate, heptadecyl (meth)acrylate, octadecyl(meth)acrylate, nonadecyl (meth)acrylate and eicosyl (meth)acrylate.

With regard to the (meth)acrylate such as an alkyl (meth) acrylate in the acrylic polymer, since it is used as a main monomer component, it is important that the proportion thereof with respect to the total amount of monomer components is 50% by weight or more, preferably 80% by weight or more and, more preferably, 90% by weight or more. Although the upper limit of the (meth)acrylate with respect to the total amount of the monomer components is not particularly limited, it is preferably 99% by weight or less (preferably 98% by weight or less and, more preferably, 97% by weight or less). When the proportion of the (meth)acrylate with respect to the total amount of the monomer components is less than 50% by weight, there are some cases where characteristics as an acrylic polymer (such as adhesive property) are hardly exerted.

In the acrylic polymer, it is possible that a monomer component which is capable of being copolymerized with the (meth)acrylate (copolymerizing monomer) is used as a monomer component. The copolymerizing monomer may be used for introduction of a cross-linking point into the acrylic polymer or for control of cohesive force of the acrylic polymer. Each copolymerizing polymer may be used solely or two or more thereof may be used in combination.

To be more specific, as the copolymerizing monomer, it is possible to use a monomer component containing a functional monomer (particularly, a monomer component containing a thermal cross-linking functional group for introduction of cross-linking point which can be subjected to a thermal cross-linking to an acrylic polymer] for introduction of a cross-linking point into an acrylic polymer. With regard to such a monomer containing a functional group, there is no particular limitation so long as it is a monomer component which is capable of being copolymerized with an alkyl(meth) acrylate and has a functional group which can be a cross-linking point and examples thereof include a monomer containing a carboxyl group such as (meth)acrylic acid, itaconic acid, crotonic acid, maleic acid, fumaric acid and isocrotonic acid or an acid anhydride thereof (such as maleic anhydride and itaconic anhydride); a hydroxyalkyl(meth)acrylate such as 2-hydroxyethyl(meth)acrylate, 2-hydroxypropyl (meth) acrylate and 2-hydroxybutyl(meth)acrylate; and, in addition, a monomer containing a hydroxyl group such as vinyl alcohol and allyl alcohol; an amide-type monomer such as (meth) acrylamide, N,N-dimethyl(meth)acrylamide, N-butyl (meth) acrylamide, N-methylol (meth)acrylamide, N-methylolpropane (meth)acrylamide, N-methoxymethyl (meth) acrylamide and N-butoxymethyl(meth)acrylamide; a monomer containing an amino group such as aminoethyl (meth)acrylate, N,N-dimethylethyl(meth)acrylate and tert-butylaminoethyl (meth)acrylate; a monomer containing an epoxy group such as glycidyl(meth)acrylate and methylglycidyl(meth)acrylate; a cyano-containing monomer such as acrylonitrile and methacrylonitrile; and a monomer having a nitrogen-containing ring such as N-vinyl-2-pyrrolidone, N-methylvinylpyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, N-vinylmorpholine, N-vinylcaprolactam and N-(meth)acryloylmorpholine. As the monomer component containing a functional group, a monomer containing a carboxyl group such as acrylic acid or an acid anhydride thereof may be advantageously used.

As a copolymerizing monomer, it is also possible to use other copolymerizing monomer component in order to control the cohesive force of the acrylic polymer. Examples of other copolymerizing monomer component as such include a monomer of a vinyl ester type such as vinyl acetate and vinyl propionate; a monomer of a styrene type such as styrene, substituted styrene (e.g., α-methylstyrene) and vinyltoluene; a monomer of an olefin type such as ethylene, propylene, isoprene, butadiene and isobutylene; vinyl chloride and vinylidene chloride; a monomer containing an isocyanate group such as 2-(meth)acryloyloxyethyl isocyanate; a monomer containing an alkoxy group such as methoxyethyl(meth) acrylate and ethoxyethyl(meth)acrylate; a monomer of a vinyl ether type such as methyl vinyl ether and ethyl vinyl ether; and a multifunctional monomer such as 1,6-hexanediol di(meth)acrylate, ethylene glycol di(meth)acrylate, diethylene glycol di(meth)acrylate, triethylene glycol di(meth)acrylate, tetraethylene glycol di(meth)acrylate, (poly)ethylene glycol di(meth)acrylate, propylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, glycerol di(meth) acrylate, epoxyacrylate, polyester acrylate, urethane acrylate, divinylbenzene, butyl di(meth)acrylate and hexyl di(meth) acrylate.

As the copolymerizing monomer in an acrylic polymer, a monomer containing a carboxyl group is preferred and, in view of heat resistance, acrylic acid may be used particularly preferably.

In the acrylic polymer, the proportion of the copolymerizing monomer may be appropriately selected within a range of less than 50% by weight with respect to the total amount of the monomer components depending upon the type of the monomer components. For example, when the copolymerizing monomer is a monomer containing a carboxyl group (particularly, acrylic acid), it is adequate that the monomer containing a carboxylic acid (particularly, acrylic acid) is 3 to 10 parts by weight (preferably 5 to 10 parts by weight and, more preferably, 7 to 10 parts by weight) with respect to 100 parts by weight of the total monomer components.

The acrylic polymer can be prepared by a conventional or common polymerization method. Examples of the polymerization method for the acrylic polymer include a solution polymerization method, an emulsion polymerization method, a bulk polymerization method and a polymerization method by irradiation of ultraviolet ray. In the polymerization of the acrylic polymer, an appropriate component which is suitable for each polymerization method such as polymerization initiator, chain transfer agent, emulsifier and solvent may be appropriately selected from conventional or common ones and may be employed.

In order to enhance the retaining characteristic of the pressure-sensitive adhesive layer, the acrylic polymer may have a cross-linking structure using a cross-linking agent or the above-mentioned multifunctional monomer as a copolymerizing monomer component. By adjusting the amount of the cross-linking agent or the multifunctional monomer used, a gel fraction (the rate of a matter which is insoluble in a solvent) in the pressure-sensitive adhesive layer may be controlled.

Besides a cross-linking agent of an isocyanate type, a cross-linking agent of an epoxy type, a cross-linking agent of a melamine type and a cross-linking agent of a peroxide type, examples of the cross-linking agent which are further listed include a cross-linking agent of a urea type, a cross-linking agent of a metal alkoxide type, a cross-linking agent of a metal chelate type, a cross-linking agent of a metal salt type, a cross-linking agent of a carbodiimide type, a cross-linking agent of an oxazoline type, a cross-linking agent of an aziridine type and a cross-linking agent of an amine type and, among them, a cross-linking agent of an isocyanate type and a cross-linking agent of an epoxy type may be advantageously used. Each of those cross-linking agents may be used solely or two or more thereof may be used in combination.

In the cross-linking agent, examples of the cross-linking agent of an isocyanate type include lower aliphatic polyisocyanates such as 1,2-ethylene diisocyanate, 1,4-butylene diisocyanate and 1,6-hexamethylene diisocyanate; alicyclic polyisocynates such as cyclopentylene diisocyanate, cyclohexylene diisocyanate, isophorone diisocyanate, hydrogenated tolylene diisocyanate and hydrogenated xylene diisocyanate; and aromatic polyisocyanates such as 2,4-tolylene diisocyanate, 2,6-tolylene diisocyanate, 4,4'-diphenylmethane diisocyanate and xylylene diisocyanate. Besides those, it is also possible to use an adduct of trimethylolpropane/tolylene diisocyanate trimer (manufactured by Nippon Polyurethane Industry Co., Ltd.; trade name: "Coronate L"), an adduct of trimethylolpropane/hexamethylene diisocyanate trimer (manufactured by Nippon Polyurethane Industry Co., Ltd.; trade name: "Coronate HL"), and the like.

Examples of the cross-linking agent of an epoxy type include N,N,N',N'-tetraglycidyl m-xylenediamine, diglycidyl aniline, 1,3-bis(N,N-glycidylaminomethyl)-cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropane polyglycidyl ether, adipic acid diglycidyl ester, o-phthalic acid diglycidyl ester, triglycidyl-tris(2-hydroxyethyl)isocyanurate, resorcinol diglycydl ether and bisphenol S-diglycidyl ether and, besides them, resins of an epoxy type having two or more epoxy groups in the molecule thereof may be also mentioned.

Instead of the use of a cross-linking agent in the present invention, it is also possible to form a pressure-sensitive adhesive layer by subjecting to a cross-linking treatment by means of irradiation of electronic ray, ultraviolet ray, and the like, together with the use of a cross-linking agent.

Weight-average molecular weight of the acrylic polymer may be appropriately selected from the range of, for example, 700,000 to 2,000,000 (preferably 800,000 to 1,700,000 or, more preferably, 900,000 to 1,400,000). When the weight-average molecular weight of the acrylic polymer is less than 700,000, there may be the case where no good adhesive characteristic is achieved while, when it is more than 2,000,000, there may be the case where problem is resulted in an applying property whereby any of them is not preferred.

The weight-average molecular weight of the acrylic polymer can be controlled by the type and the use amount of polymerization initiator and chain transfer agent, by temperature and time for the polymerization and further by concentration of the monomer, dropping speed of the monomer, and the like. Incidentally, in the present invention, the weight-average molecular weight of the acrylic polymer was measured under the same conditions as in the case of the low-molecular weight polymer component.

Pressure-Sensitive Adhesive Layer

A pressure-sensitive adhesive layer in the double-sided pressure-sensitive adhesive tape or sheet for wiring circuit board according to the present invention is formed by a pressure-sensitive adhesive composition which contains at least an acrylic polymer and a chain transfer substance (a tackifier resin having a chain transfer property as a chain transfer substance, a low-molecular weight polymer composition containing a chain transfer agent as a chain transfer substance, etc.) as mentioned above. In addition to the above-mentioned components, the pressure-sensitive adhesive composition for formation of a pressure-sensitive adhesive layer may further contain conventional additives such as aging preventer, filler, coloring agent (pigment, dye, etc.), ultraviolet absorber, antioxidant, adhesion-imparting agent, plasticizer, softener, cross-linking agent, surfactant and antistatic agent within such an extent that characteristics of the present invention are not deteriorated.

In the pressure-sensitive adhesive composition for formation of a pressure-sensitive adhesive layer, the rate of the chain transfer substance contained therein may be appropriately selected depending upon the type of the chain transfer substance as mentioned above.

Such a pressure-sensitive adhesive composition can be prepared by mixing an acrylic polymer, a chain transfer substance or a composition containing a chain transfer substance (such as a tackifier resin having a chain transfer property as a chain transfer substance and a low-molecular weight polymer composition containing a chain transfer agent as a chain transfer substance) and optional various kinds of additives.

There is no particular limitation for the method of forming a pressure-sensitive adhesive layer but the method may be appropriately selected from the conventional method for the formation of a pressure-sensitive adhesive layer. Specific examples of the method for the formation of a pressure-sensitive adhesive layer include a method where a pressure-sensitive adhesive composition is applied on a surface (such as a substrate) whereby the thickness after drying becomes a predetermined thickness and then optionally dried or hardened, and a method where a pressure-sensitive adhesive composition is applied on an appropriate separator (such as a release paper) whereby the thickness after drying becomes a predetermined thickness and then optionally dried or hardened and the resulting adhesive layer is transcribed (transferred) onto a predetermined surface (such as a substrate). In applying the pressure-sensitive adhesive composition, commonly used applying devices (such as a gravure roll coater, a reverse roll coater, a kiss roll coater, a dip roll coater, a bar coater, a knife coater and a spray coater) may be used.

Although the thickness of the pressure-sensitive adhesive layer is not particularly limited, it may be appropriately selected from the range of, for example, 10 to 70 μm (preferably 15 to 60 μm and, more preferably, 20 to 50 μm). When the thickness of a pressure-sensitive adhesive layer is less than 10 μm, there is a tendency that no good adhesive property is achieved while, when it is more than 70 μm, there are some cases where the product is not suitable for the use as a wiring circuit board. Incidentally, the pressure-sensitive adhesive layer may be in any of forms of single layer and plural layers.

Double-sided pressure-sensitive adhesive tape or sheet for wiring circuit board

As mentioned above, it is important that the double-sided pressure-sensitive adhesive tape or sheet for wiring circuit board includes a pressure-sensitive adhesive layer formed by a pressure-sensitive adhesive composition which contains an acrylic polymer as a main component and a chain transfer substance and which has a characteristic that the gel fraction in the initial stage is 40 to 70% by weight and that the gel fraction difference [i.e., difference between the gel fraction (% by weight) after a reflow step and the gel fraction (% by weight) in the initial stage] is 10 or less. As such, although the double-sided pressure-sensitive adhesive tape or sheet for wiring circuit board may be a double-sided pressure-sensitive adhesive tape or sheet which has no substrate and has only a pressure-sensitive adhesive layer (a double-sided pressure-sensitive adhesive tape or sheet having no substrate) so long as it has the aforementioned pressure-sensitive adhesive layer, it is advantageous that, as shown in FIG. 1, it is a double-sided pressure-sensitive adhesive tape or sheet having such a constitution that pressure-sensitive adhesive layers are formed on both sides of the substrate (a double-sided pressure-sensitive adhesive tape or sheet having a substrate).

When the double-sided pressure-sensitive adhesive tape or sheet for wiring circuit board is a double-side adhesive tape or sheet having a substrate, although a pressure-sensitive adhesive layer containing a chain transfer substance is formed on at least one surface of the substrate, it is preferred that such pressure-sensitive adhesive layers are formed on both surfaces of the substrate as shown in FIG. 1. Incidentally, when a pressure-sensitive adhesive layer containing a chain transfer substance is formed on one surface of the substrate, a conventional pressure-sensitive adhesive layer or adhesive layer may be formed on the other surface of the substrate.

In such a double-sided pressure-sensitive adhesive tape or sheet for wiring circuit board, it is preferred that the surface of the pressure-sensitive adhesive layer is protected by a release liner. Incidentally, in the double-sided pressure-sensitive adhesive tape or sheet for wiring circuit board, although each pressure-sensitive adhesive surface is protected by two release liners, it is preferred to be protected in a form of being wound in a roll by one sheet of a release liner where both sides are release surfaces as shown in FIG. 1.

In the present invention, the double-sided pressure-sensitive adhesive tape or sheet for wiring circuit board may be produced in a form of being wound in a roll or in a form where sheets are layered. Thus, the double-sided pressure-sensitive adhesive tape or sheet for wiring circuit board may be in a form of sheet, tape, etc. When the double-sided pressure-sensitive adhesive tape or sheet for wiring circuit board has a form being wound in a roll, it is usual that each pressure-sensitive adhesive surface (surface of the pressure-sensitive adhesive layer) has a form of being wound in a roll being protected by one or two release liner(s).

The double-sided pressure-sensitive adhesive tape or sheet for wiring circuit board may have other layers (such as an intermediate layer and an undercoated layer) within such an extent that the advantages of the present invention are not deteriorated by them.

Substrate

As a substrate, that having a heat resisting property is preferred and it is possible to use an appropriate thin leafy substance, for example, a fibrous substrate such as cloth, nonwoven fabric, felt and net; a paper substrate such as various types of paper; a metal substrate such as metal foil and metal plate; a plastic substrate such as film or sheet of various kinds of resins (e.g., olefin resin, polyester resin, polyvinyl chloride resin, vinyl acetate resin, amide resin, polyimide resin, polyether ether ketone and polyphenylene sulfide); a foamed product such as foamed sheet; and a layered product thereof. The substrate may be in a form of single layer or may have a form of plural layers.

In view of heat-resisting property, anchoring property of an adhesive agent, cost, etc. in the present invention, a fibrous substrate is preferred as a substrate and nonwoven fabric may be used particularly preferably. With regard to a nonwoven fabric, that by natural fiber having a heat-resisting property may be used advantageously and a nonwoven fabric containing Manila hemp may be used particularly advantageously. Even within a preferred range of gel fraction in the present invention, there is a tendency that a processing property lowers due to blocking of an adhesive (re-adhesion) in a region where gel fraction is low but, if the above-mentioned nonwoven fabric is used as a substrate, a processing property becomes good and that is preferred.

Thickness of the substrate may be appropriately determined depending upon the use and, in general, it is, for example, within 5 to 40 μm (preferably 10 to 30 μm and, more preferably, 10 to 20 μm)

When the substrate is nonwoven fabric, although there is no particular limitation for the package weight of the nonwoven fabric, it is preferably 5 to 15 $g/m^2$ and, particularly preferably, 6 to 10 $g/m^2$. When the package weight of nonwoven fabric is less than 5 $g/m^2$, the strength lowers while, when it is more than 15 $g/m^2$, it is difficult to fulfill the required thickness.

With regard to the strength of the substrate, that in an MD direction (longitudinal direction or machine direction) is preferably 2 (N/15 mm) or more and, more preferably, 5 (N/15 mm) or more.

If necessary, surface of the substrate may be applied with an oxidation treatment by a chemical or physical method such as by means of common surface treatment such as treatment with chromic acid, exposure to ozone, exposure to flame, exposure to high-voltage electric shock and treatment with ionizing radiant ray for enhancing the close adhesion to the adhesive layer. A coating treatment by an undercoating agent may be applied as well.

Release Liner

With regard to a release liner (separator), a commonly used release paper or the like may be used. A release liner is used as a protector for a pressure-sensitive adhesive agent and is taken off when the double-sided pressure-sensitive adhesive tape or sheet for wiring circuit board is adhered to a wiring circuit board or reinforcing board. Incidentally, it is not always necessary to employ the release liner.

Examples of the release liner which may be used include a substrate having a release-treating layer such as plastic or paper which is subjected to a surface treatment with a release-treating agent of a silicone type, a long-chain alkyl type, a fluorine type, a molybdenum sulfide type, etc.; a lowly adhesive substrate comprising a fluorine-type polymer such as polytetrafluoroethylene, polychlorotrifluoroethylene, polyvinyl fluoride, a copolymer of polyvinylidene fluoride with hexafluoropropylene and a copolymer of chlorofluoroethylene with vinylidene fluoride; and a lowly adhesive substrate comprising a nonpolar polymer such as an olefin-type resin (such as polyethylene and polypropylene).

The release liner may be formed by a conventional or common method. There is no particular limitation for thickness of the release liner as well.

The double-sided pressure-sensitive adhesive tape or sheet for wiring circuit board according to the present invention can be prepared utilizing the above-exemplified method for the formation of a pressure-sensitive adhesive layer in such a manner that a pressure-sensitive adhesive layer is formed on each side of the substrate optionally through other layer in the case of a double-sided pressure-sensitive adhesive tape or sheet having a substrate, or in such a manner that a pressure-sensitive adhesive layer is formed on a release liner optionally through via other layer in the case of a double-sided pressure-sensitive adhesive tape or sheet having no substrate.

In the present invention, in the double-sided pressure-sensitive adhesive tape or sheet for wiring circuit board, thickness from one pressure-sensitive adhesive surface to the other pressure-sensitive adhesive surface is preferably 20 to 70 µm, more preferably 30 to 60 µm and, particularly preferably, 40 to 60 µm. When the thickness from one pressure-sensitive adhesive surface to the other pressure-sensitive adhesive surface is less than 20 µm in the double-sided pressure-sensitive adhesive tape or sheet for wiring circuit board, there are some cases where good pressure-sensitive adhesive property or adhesive property is not achieved while, when it is more than 70 µm, the thickness is too much whereby it is not generally suitable as a double-sided pressure-sensitive adhesive tape or sheet for wiring circuit board.

In the double-sided pressure-sensitive adhesive tape or sheet for wiring circuit board according to the present invention, the pressure-sensitive adhesive layer has such a characteristic that the gel fraction in the initial stage is 40 to 70% by weight and that difference in gel fractions is 10 or less whereby a good adhesive force is available and, even when subjected to a high-temperature step such as a solder reflow step, an excellent anti-repulsion property can be exerted and it is also possible to suppress or prevent the self-adhesion of the cut surfaces after a cutting process. Accordingly, it can be advantageously used as a double-sided pressure-sensitive adhesive tape or sheet used for wiring circuit board (particularly as a double-sided pressure-sensitive adhesive tape or sheet for use in fixing a wiring circuit board on a support such as a reinforcing plate).

Wiring Circuit Board

The wiring circuit board of the present invention has at least an electric insulator layer (may be sometimes called "base insulating layer") and an electric conductor layer (may be sometimes called "conductor layer") formed on the above base insulating layer to form a predetermined circuit pattern and, on the back side (i.e., an opposite side to the conductor layer of the base insulating layer) of the wiring circuit board, the above-mentioned double-sided pressure-sensitive adhesive tape or sheet for wiring circuit board is adhered. Accordingly, the wiring circuit board of the present invention can be, for example, fixed to a support such as a reinforcing plate utilizing the double-sided pressure-sensitive adhesive tap or sheet for wiring circuit board adhered on the back side.

In the present invention, the wiring circuit board may optionally have an electric insulator layer for covering (may be sometimes called "cover insulation layer"), and the like disposed on the above-mentioned conductor layer in addition to a base insulating layer and a conductor layer formed on the above base insulating layer so as to form a predetermined pattern.

The wiring circuit board may also have a multi-layered structure where plural wiring circuit boards are layered. With regard to the numbers of the wiring circuit board (layer numbers of the multiple layers) in the wiring circuit board in a multi-layered structure, there is no particular limitation provided that the numbers are 2 or more.

With regard to the wiring circuit board of the present invention, although there is no particular limitation so long as it is a wiring circuit board, a flexible printing wiring circuit board (FPC) is advantageous. The wiring circuit board of the present invention may be advantageously used as a wiring circuit board to be used in various kinds of electronic instruments.

Base Insulating Layer

A base insulating layer is an electric insulator layer formed by an electric insulator. As the electric insulator for formation of a base insulating layer, there is no particular limitation and it can be appropriately selected from known electric insulators in wiring circuit board and used. Examples of the electric insulator include a plastic material such as polyimide resin, acrylate resin, polyether nitrile resin, polyether sulfone resin, polyester resin (such as polyethylene terephthalate resin and polyethylene naphthalate resin), polyvinyl chloride resin, polyphenylene sulfide resin, polyether ketone resin, polyamide resin (such as the so-called "aramid resin"), polyallylate resin, polycarbonate resin and liquid crystal polymer; a ceramic material such as alumina, zirconia, soda glass and quartz glass; and various kinds of compounded materials having electric insulating property (non-conductive property). Each of electric insulators may be used solely or two or more thereof may be used in combination.

As the electric insulator in the present invention, a plastic material (particularly a polyimide resin) is advantageous. Accordingly, a base insulating layer is preferred to be formed by a plastic film or sheet (particularly, film or sheet which is prepared by a polyimide resin).

As the electric insulator, an electric insulator having photosensitivity (e.g., a photosensitive plastic material such as photosensitive polyimide resin) may also be used.

A base insulating layer may be in any form of single layer and layered product. Surface of the base insulating layer may be subjected to various kinds of surface treatment (such as corona discharge treatment, plasma treatment, surface-roughening treatment and hydrolyzing treatment).

Although there is no particular limitation for thickness of the base insulating layer, it may be appropriately selected within the range of, for example, 3 to 100 µm (preferably 5 to 50 µm and, more preferably, 10 to 30 µm).

Conductor Layer

A conductor layer is an electric conductor layer formed by an electrically conductive material. The conductor layer is formed on the above-mentioned base insulating layer so as to form a predetermined circuit pattern. As the electrically conductor material for the formation of such a conductor layer, there is no particular limitation and appropriate one may be selected from the electrically conductive materials used for known wiring circuit boards and is used. Specific examples of the electrically conductive material include various kinds of alloy (such as solder), metal material such as platinum and an electrically conductive plastic material in addition to copper, nickel, gold and chromium. Each electrically conductive material may be used solely or two or more thereof may be used in combination. In the present invention, a metal material (particularly copper) is suitable as an electrically conductive material.

A conductor layer may be in any form of single layer and layered product. Surface of the conductor layer may be subjected to various kinds of surface treatment.

Although there is no particular limitation for thickness of the conductor layer, it may be appropriately selected within, for example, a range of 1 to 50 µm (preferably 2 to 30 µm and, more preferably, 3 to 20 µm).

With regard to a method for the formation of a conductor layer, there is no particular limitation but it may be appropriately selected from known methods for the formation thereof (known patterning method such as a subtractive method, an additive method and a semi-additive method). When, for example, a conductor layer is directly formed on the surface of a base insulating layer, a conductor layer can be formed by plating or vapor deposition of a conductor material on a base insulating layer utilizing a non-electrolytic plating method, an electrolytic plating method, a vacuum vapor deposition method, a sputtering method, and the like so as to give a predetermined circuit pattern.

Cover Insulating Layer

A cover insulating layer is an electric insulator layer for covering (electric insulator layer for protection) which is formed by an electric insulating material and covers the conductor layer. A cover insulating layer is disposed according to the necessity and is not necessary to be disposed at all times. As the electrically insulating material for the formation of a cover insulating material, there is no particular limitation but, the same as in the case of a base insulating layer, it may be appropriately selected from electrically insulating materials used in known wiring circuit boards and is used. To be more specific, As the electrically insulating material for the formation of a cover insulating layer, examples thereof include the electrically insulating material which are exemplified as an electrically insulating material for the formation of the above base insulating layer and, the same as in the case of a base insulating layer, a plastic material (particularly a polyimide resin) is advantageous. Each electrically insulating material for the formation of a cover insulating layer may be used solely or two or more thereof may be used in combination.

A cover insulating layer may be in any of the forms of single layer and layered product. Surface of the cover insulating layer may be subjected to various kinds of surface treatment (such as corona discharge treatment, plasma treatment, treatment for making the surface rough and hydrolyzing treatment).

With regard to thickness of a cover insulating layer, there is no particular limitation but it may be appropriately selected within, for example, a range of 3 to 100 µm (preferably 5 to 50 µm and, more preferably, 10 to 30 µm).

With regard to a method for the formation of a cover insulating layer, there is no particular limitation but it may be appropriately selected from known methods for the formation (such as a method where a liquid substance or a melted substance containing an electrically insulating material is applied followed by drying, and a method where film or sheet which corresponds to the shape of the conductor layer and is formed from an electrically insulating material is layered).

Reinforcing Plate

The wiring circuit board of the present invention may, for example, be used by being fixed to a support such as a reinforcing plate. Such a reinforcing plate is usually disposed on the side opposite to the conductor layer of the base insulting layer (back side). With regard to the reinforcing material for the formation of the reinforcing plate, there is no particular limitation but it may be appropriately selected from known reinforcing plate materials for the formation of reinforcing plate and is used. The reinforcing plate material may be that having electric conductivity or that having no electric conductivity. To be more specific, examples of the reinforcing plate material include a metal material such as stainless steel, aluminum, copper, iron, gold, silver, nickel, titanium and chromium; a plastic material such as polyimide resin, acrylate resin, polyether nitrile resin, polyether sulfone resin, polyester resin (such as polyethylene terephthalate resin and polyethylene naphthalate resin), polyvinyl chloride resin, polyphenylene sulfide resin, polyether ether ketone resin, polyamide resin (such as the so-called "aramid resin"), polyallylate resin, polycarbonate resin, epoxy resin, glass epoxy resin and liquid polymer; and an inorganic material such as alumina, zirconia, soda glass, quartz glass and carbon. Each reinforcing material may be used solely or two or more thereof may be sued in combination.

As the reinforcing plate material, a metal plate such as stainless steel and aluminum and a plastic material such as polyimide resin are advantageous and, among them, stainless steel and aluminum can be used especially advantageously. Accordingly, it is preferable that the reinforcing plate is formed by metal foil or metal plate (such as stainless steel foil or plate and aluminum foil or plate) or a plastic film or sheet (such as film or sheet made of polyimide resin).

A reinforcing plate may be in any of the forms of single layer and layered product. Surface of the reinforcing plate may be subjected to various kinds of surface treatment.

With regard to thickness of a reinforcing plate, there is no particular limitation but it may be appropriately selected within, for example, a range of 50 to 2,000 µm (preferably 100 to 1,000 µm).

EXAMPLES

The present invention will now be more particularly illustrated by way of the following Examples. However, the present invention is not limited thereto.

Example 1

2-Ethylhexyl acrylate (90 parts by weight) and 10 parts by weight of acrylic acid were subjected to a solution polymerization treatment by stirring at 60 to 80° C. in 210 parts of ethyl acetate in the presence of 0.4 part by weight of 2,2'-azobisisobutyronitrile under substitution with nitrogen to prepare a pressure-sensitive adhesive solution (viscosity: about 120 poises; degree of polymerization: 99.2%; solid: 30.0% by weight; may be sometimes called "pressure-sensitive adhesive solution A").

To 100 parts by weight of the above-prepared pressure-sensitive adhesive solution A were added 25 parts of "YS Polystar S145" (trade name) (terpene phenol-type resin manufactured by Yasuhara Chemical Co., Ltd.; softening point: 145° C.; may be sometimes called "tackifier resin A having chain transfer property") and 0.05 part by weight of a multifunctional epoxy cross-linking agent (trade name: "Tetrad C"; manufactured by Mitsubishi Gas Chemical Company, Inc.; may be sometimes called "cross-linking agent A") followed by mixing to give a pressure-sensitive adhesive composition (may be sometimes called "pressure-sensitive adhesive composition A").

A release treatment layer comprising a silicone-type release treatment agent was formed on the surface of glassine paper to prepare a release liner. The pressure-sensitive adhesive composition A was applied on the surface of the release liner (the surface of the release treatment layer) and dried at 130° C. for 5 minutes to form a pressure-sensitive adhesive layer having 20 μm thickness. After that, nonwoven fabric of Manila hemp (thickness: 18 μm) was laminated on the pressure-sensitive adhesive layer, then the above pressure-sensitive adhesive composition A was applied onto the surface of the nonwoven fabric and a drying treatment at 130° C. was conducted for 5 minutes to form a pressure-sensitive adhesive layer whereby a double-sided pressure-sensitive adhesive tape or sheet where the total thickness (thickness from the surface of one pressure-sensitive adhesive layer to the surface of another pressure-sensitive adhesive layer) was 50 μm was prepared.

Example 2

A pressure-sensitive adhesive solution A was prepared by the same manner as in Example 1. To 100 parts by weight of the pressure-sensitive adhesive solution A were added 30 parts by weight of a tackifier resin A having a chain transfer property and 0.05 part by weight of a cross-linking agent A followed by mixing to give a pressure-sensitive adhesive composition (may be sometimes called "pressure-sensitive adhesive composition B").

The same operation as in Example 1 was carried out except that this pressure-sensitive adhesive composition B was used to give a double-sided pressure-sensitive adhesive tape or sheet where total thickness was 50 μm.

Example 3

A pressure-sensitive adhesive solution A was prepared by the same manner as in Example 1. To 100 parts by weight of the pressure-sensitive adhesive solution A were added 25 parts by weight of a tackifier resin A having a chain transfer property and 0.075 part by weight of a cross-linking agent A followed by mixing to give a pressure-sensitive adhesive composition (may be sometimes called "pressure-sensitive adhesive composition C").

The same operation as in Example 1 was carried out except that this pressure-sensitive adhesive composition C was used to give a double-sided pressure-sensitive adhesive tape or sheet where total thickness was 50 μm.

Example 4

A pressure-sensitive adhesive solution A was prepared by the same manner as in Example 1. To 100 parts by weight of the pressure-sensitive adhesive solution A were added 30 parts by weight of a tackifier resin A having a chain transfer property and 0.075 part by weight of a cross-linking agent A followed by mixing to give a pressure-sensitive adhesive composition (may be sometimes called "pressure-sensitive adhesive composition D").

The same operation as in Example 1 was carried out except that this pressure-sensitive adhesive composition D was used to give a double-sided pressure-sensitive adhesive tape or sheet where total thickness was 50 μm.

Example 5

Cyclohexyl methacrylate (glass transition temperature of a homopolymer (polycyclohexyl methacrylate): 66° C.] (95 parts by weight) and 5 parts by weight of acrylic acid as monomer components, 10 parts by weight of α-methylstyrene dimer as a chain transfer agent, 10 parts by weight of 2,2'-azobisisobutyronitrile as a polymerization initiator and 120 parts by weight of toluene as a polymerization solvent were placed into a separable flask and stirred for 1 hour together with introduction of nitrogen gas. After oxygen in the polymerization system was removed as such, temperature was raised to 85° C. and reaction was conducted for 5 hours to give a low-molecular weight polymer composition (may be sometimes called "low-molecular weight polymer A") where solid concentration was 50% by weight. Weight-average molecular weight of a low-molecular weight polymer in the low-molecular weight polymer A was 4,000.

A pressure-sensitive adhesive solution A was prepared by the same manner as in Example 1. To 100 parts by weight of the above pressure-sensitive adhesive solution A were added 10 parts by weight of a low-molecular weight polymer A (weight-average molecular weight: 4,000; as a chain transfer agent, 2-mercaptoethanol was used in an amount of 3% by weight to the total amount of the monomer components) and 0.04 part by weight of a cross-linking agent followed by mixing to give a pressure-sensitive adhesive composition (may be sometimes called "pressure-sensitive adhesive composition E").

The same operation as in Example 1 was carried out except that this pressure-sensitive adhesive composition E was used to give a double-sided pressure-sensitive adhesive tape or sheet where the total thickness was 50 μm.

Example 6

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 10 parts by weight of the low-molecular weight polymer A and 0.075 part by weight of a cross-linking agent A followed by mixing to give a pressure-sensitive adhesive composition (may be sometimes called "pressure-sensitive adhesive composition F").

The same operation as in Example 1 was carried out except that this pressure-sensitive adhesive composition F was used to give a double-sided pressure-sensitive adhesive tape or sheet where total thickness was 50 μm.

Example 7

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 8 parts by weight of the low-molecular weight polymer A and 0.05 part by weight of a cross-linking agent A followed by mixing to give a pressure-sensitive adhesive composition (may be sometimes called "pressure-sensitive adhesive composition G").

The same operation as in Example 1 was carried out except that this pressure-sensitive adhesive composition G was used to give a double-sided pressure-sensitive adhesive tape or sheet where total thickness was 50 μm.

Example 8

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 10 parts by weight of the low-molecular weight polymer A and 0.05 part by weight of a cross-linking agent A followed by mixing to give a pressure-sensitive adhesive composition (may be sometimes called "pressure-sensitive adhesive composition H").

The same operation as in Example 1 was carried out except that this pressure-sensitive adhesive composition H was used to give a double-sided pressure-sensitive adhesive tape or sheet where total thickness was 50 μm.

Example 9

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 12 parts by weight of the low-molecular weight polymer A and 0.05 part by weight of a cross-linking agent A followed by mixing to give a pressure-sensitive adhesive composition (may be sometimes called "pressure-sensitive adhesive composition I").

The same operation as in Example 1 was carried out except that this pressure-sensitive adhesive composition I was used to give a double-sided pressure-sensitive adhesive tape or sheet where total thickness was 50 μm.

Example 10

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 20 parts by weight of the low-molecular weight polymer A and 0.075 part by weight of a cross-linking agent A followed by mixing to give a pressure-sensitive adhesive composition (may be sometimes called "pressure-sensitive adhesive composition J").

The same operation as in Example 1 was carried out except that this pressure-sensitive adhesive composition J was used to give a double-sided pressure-sensitive adhesive tape or sheet where total thickness was 50 μm.

Example 11

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 25 parts by weight of the low-molecular weight polymer A and 0.075 part by weight of a cross-linking agent A followed by mixing to give a pressure-sensitive adhesive composition (may be sometimes called "pressure-sensitive adhesive composition K").

The same operation as in Example 1 was carried out except that this pressure-sensitive adhesive composition K was used to give a double-sided pressure-sensitive adhesive tape or sheet where total thickness was 50 μm.

Example 12

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 18 parts by weight of the tackifier resin A having a chain transfer property, 3 parts by weight of the low-molecular weight polymer A and 0.05 part by weight of a cross-linking agent A followed by mixing to give a pressure-sensitive adhesive composition (may be sometimes called "pressure-sensitive adhesive composition L").

The same operation as in Example 1 was carried out except that this pressure-sensitive adhesive composition L was used to give a double-sided pressure-sensitive adhesive tape or sheet where total thickness was 50 μm.

Example 13

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 13 parts by weight of the tackifier resin A having a chain transfer property, 5 parts by weight of the low-molecular weight polymer A and 0.05 part by weight of a cross-linking agent A followed by mixing to give a pressure-sensitive adhesive composition (may be sometimes called "pressure-sensitive adhesive composition M").

The same operation as in Example 1 was carried out except that this pressure-sensitive adhesive composition M was used to give a double-sided pressure-sensitive adhesive tape or sheet where total thickness was 50 μm.

Example 14

A pressure-sensitive adhesive solution A was prepared by the same manner as in Example 1. A low-molecular weight polymer A was also prepared by the same manner as in Example 5. To 100 parts by weight of the above-mentioned pressure-sensitive adhesive solution A were added 6 parts by weight of the tackifier resin A having a chain transfer property, 8 parts by weight of the low-molecular weight polymer A and 0.05 part by weight of a cross-linking agent A followed by mixing to give a pressure-sensitive adhesive composition (may be sometimes called "pressure-sensitive adhesive composition N").

The same operation as in Example 1 was carried out except that this adhesive composition N was used to give a double-sided pressure-sensitive adhesive tape or sheet where total thickness was 50 μm.

Comparative Example 1

A pressure-sensitive adhesive solution A was prepared by the same manner as in Example 1. To 100 parts by weight of the above-mentioned pressure-sensitive adhesive solution A was added 0.175 part by weight of a cross-linking agent A followed by mixing to give a pressure-sensitive adhesive composition (may be sometimes called "pressure-sensitive adhesive composition O").

In the same manner as in Example 1, a release treatment layer comprising a silicone-type release treatment agent was formed on the surface of glassine paper to prepare a release liner. The pressure-sensitive adhesive composition O was applied on the surface of the release liner (the surface of the release treatment layer) and dried at 130° C. for 5 minutes to form a pressure-sensitive adhesive layer (pressure-sensitive adhesive layer) having 50 μm thickness whereby a double-sided pressure-sensitive adhesive tape or sheet including only the pressure-sensitive adhesive layer where the total thickness was 50 μm was prepared.

Comparative Example 2

A pressure-sensitive adhesive solution A was prepared by the same manner as in Example 1. To 100 parts by weight of the above-mentioned pressure-sensitive adhesive solution A was added 0.03 part by weight of a cross-linking agent A followed by mixing to give a pressure-sensitive adhesive composition (may be sometimes called "pressure-sensitive adhesive composition P").

The same operation as in Example 1 was carried out except that this pressure-sensitive adhesive composition P was used to give a double-sided pressure-sensitive adhesive tape or sheet where total thickness was 50 μm.

Evaluation

Gel fractions of the pressure-sensitive adhesive layer before and after the heat treatment and difference between them (gel fraction in the initial stage, gel fraction after reflow step and difference in gel fractions), adhesive force, anti-repulsion property and processing property of the double-sided pressure-sensitive adhesive tapes or sheets prepared in Examples 1 to 14 and Comparative Examples 1 to 2 were measured or evaluated by the following measuring method or evaluation method. Result of the measurement or the evaluation is shown in Table 1.

As mentioned above, the gel fraction after reflow step is a gel fraction after a solder flow step satisfying the following heat treatment conditions and difference in gel fraction is the difference between the gel fraction after the solder reflow step (% by weight) and the gel fraction in the initial stage (% by weight).

(Heat Treatment Conditions in a Solder Reflow Step)

(a) The surface temperature of the double-sided pressure-sensitive adhesive tape or sheet (or the pressure-sensitive adhesive layer) reaches 175±10° C. (165 to 185° C.) within 130 to 180 seconds after start of the solder reflow step for said pressure-sensitive adhesive tape or sheet.

(b) The surface temperature of the double-sided pressure-sensitive adhesive tape or sheet (or the pressure-sensitive adhesive layer) reaches 230±10° C. (220 to 240° C.) within 200 to 250 seconds after start of the solder reflow step for said pressure-sensitive adhesive tape or sheet.

(c) The surface temperature of the double-sided pressure-sensitive adhesive tape or sheet (or the pressure-sensitive adhesive layer) reaches 255±15° C. (240 to 270° C.) within 260 to 300 seconds after start of the solder reflow step for said pressure-sensitive adhesive tape or sheet.

(d) The solder reflow step finishes within 370 seconds after start of the solder reflow step for said pressure-sensitive adhesive tape or sheet.

Surface temperature of the double-sided pressure-sensitive adhesive tape or sheet (or pressure-sensitive adhesive layer) in the solder reflow step was measured continuously via a temperature sensor after fixing a thermocouple on the surface of the double-sided pressure-sensitive adhesive tape or sheet (or pressure-sensitive adhesive layer). At that time, the solder reflow instrument used in the solder reflow step and the temperature sensor used in the measurement of the surface temperature are as follows.

Solder reflow instrument: Conveyer-type far-infrared hot wind heating device (manufactured by Noritake Co., Ltd.)

Temperature sensor: Keyence NR-250 (Keyence Corporation)

Gel fractions before and after heat treatment and method for measuring the difference between them Each of the pressure-sensitive adhesive compositions (pressure-sensitive adhesive composition A to pressure-sensitive adhesive composition P) for the formation of a pressure-sensitive adhesive layer in each double-sided pressure-sensitive adhesive tape or sheet is applied onto a release line and then dried or hardened to form a pressure-sensitive adhesive layer (may be sometimes called "pressure-sensitive adhesive layer in the initial stage").

Further, a pressure-sensitive adhesive layer which was formed by the same manner as above is set in a solder reflow instrument or device which was set for fulfilling the above-mentioned heat treatment conditions [highest temperature or peak temperature is set at 260° C.; conveyer-type far-infrared hot wind heating device (manufactured by Noritake Co., Ltd.)] and then subjected to a heat treatment (the resulting pressure-sensitive adhesive layer after the heat treatment may be sometimes called "pressure-sensitive adhesive layer after heating"). Surface temperature of the pressure-sensitive adhesive layer was continuously measured via a temperature sensor [Keyence NR-250 (manufactured by Keyence Corporation)] after fixing a thermocouple on the surface of the pressure-sensitive adhesive layer.

Each of the pressure-sensitive adhesive layers (the pressure-sensitive adhesive layer of initial the stage and the pressure-sensitive adhesive layer after heating) is detached from a release liner in a size of 5 cm×5 cm, wrapped with a tetrafluoroethylene sheet (trade name: "NTF 1122" manufactured by Nitto Denko Corporation) having a diameter of 0.2 μm and tied with kite string and the weight at that time is measured and defined as the weight before dipping. Incidentally, the weight before dipping is the total weight of the pressure-sensitive adhesive layer, the tetrafluoroethylene sheet and the kite string. Weight of the tetrafluoroethylene sheet and the kite string is also measured and defined the weight as a package weight.

After that, a pressure-sensitive adhesive layer (pressure-sensitive adhesive layer of initial the stage or adhesive layer after heating) is wrapped with a tetrafluoroethylene sheet, tied with kite string, placed in a 50-ml container filled with ethyl acetate and allowed to stand at room temperature for one week (seven days). After that, the tetrafluoroethylene sheet is taken out from the container, transferred to a cup made of aluminum and dried in a drier at 130° C. for 2 hours to remove ethyl acetate and weight of the sample is measured and adopted as the weight after dipping.

Gel fraction is then calculated by the following formula.

$$\text{Gel fraction(\% by weigh)} = (A-B)/(C-B) \times 100 \quad (1)$$

(In the formula (1), A is the weight after dipping, B is a package weight and C is the weight before dipping).

Difference in gel fractions between before and after the heat treatment (gel fraction difference) is calculated by the following formula from the gel fraction of the pressure-sensitive adhesive layer in the initial stage (% by weight) and the gel fraction of the pressure-sensitive adhesive layer after heating (% by weight).

$$\text{Gel fraction difference(points)} = E-D \quad (2)$$

(In the formula (2), D is the gel fraction of the pressure-sensitive adhesive layer in the initial stage (% by weight) and E is the gel fraction of the pressure-sensitive adhesive layer after heating (% by weight)).

Method for Measurement of Adhesive Force

Each double-sided pressure-sensitive adhesive tape or sheet is cut into a size of 20 mm width and 100 mm length, a polyester film (thickness: 25 µm) is adhered on one pressure-sensitive adhesive side, then another side is adhered to a polished plate made of stainless steel by a method where a roller of 2 kg is subjected to one reciprocation, aging is conducted for 30 minutes under the conditions of 23° C. temperature and 65% relative humidity and torn off using a tensile tester under the condition of 180° C. tearing angle and 300 mm/minute rate whereby a 180° peel strength (N/20 mm) is measured.

Method for Evaluation of Anti-Repulsion Property

One of the adhesive sides of each double-sided pressure-sensitive adhesive tape or sheet is adhered to a model FPC (having a characteristic as shown in Table 2) as a lining material using a hand roller under the condition of 23° C., then adhered with pressure at 0.4 MPa at about 60° C. using a laminator and cut into a size of 50 mm length and 10 mm width to prepare a sample for evaluation of anti-repulsion property in the initial stage (i.e., a sample which was not subjected to a solder reflow step).

Further, one of the adhesive sides of each double-sided pressure-sensitive adhesive tape or sheet is adhered to a model FPC (having a characteristic as shown in Table 2) as a lining material using a hand roller under the condition of 23° C., then adhered with the pressure of 0.4 MPa at about 60° C. using a laminator, subjected to a solder reflow step where the above-mentioned condition for heating treatment is requisite (highest temperature or peak temperature is set at 260° C.) and cut into a size of 50 mm length and 10 mm width to prepare a sample for evaluation of anti-repulsion property after a reflow step.

Figure 3:
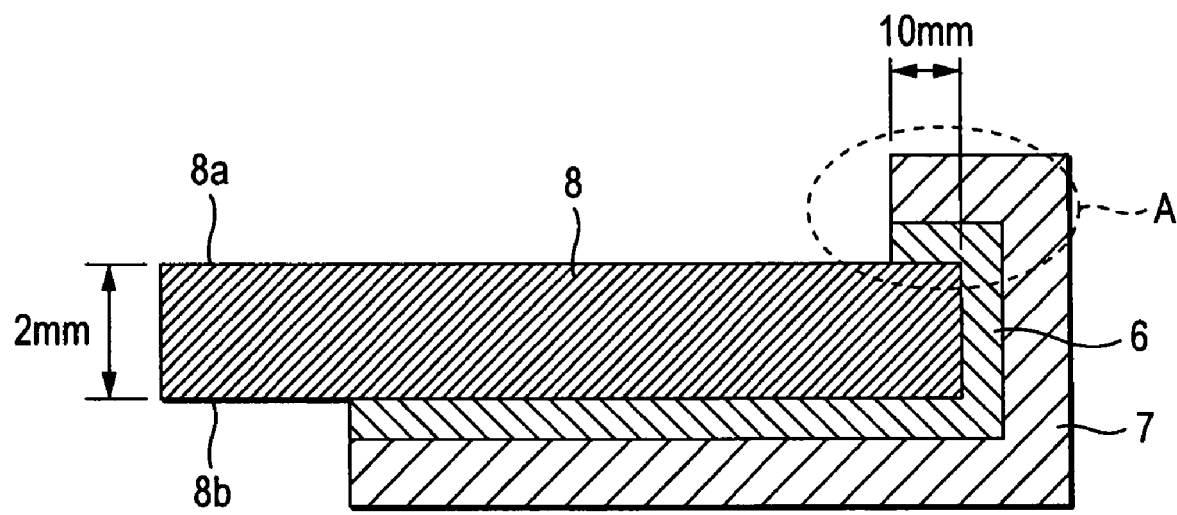
FIG. 3 is a rough cross-sectional view which shows the adhered state of the double-sided pressure-sensitive adhesive tape or sheet for evaluation of anti-repulsive force in a method for evaluation of anti-repulsion property.

Each of the samples for evaluation of anti-repulsion property prepared as such is adhered to the surface of a polyimide plate in an adherend [a layered plate of a polyimide plate (trade name: "Kapton 300H" manufactured by DuPont; thickness: 75 µm) with an aluminum plate; total thickness: 2 mm] using a roller of 2 kg (one reciprocal movement) under the condition of 23° C. to the site of one of the ends so as to make the adhered area 10 mm×10 mm followed by being allowed to stand for 30 minutes. After each sample for evaluation of anti-repulsion property is allowed to stand for 30 minutes, it is folded and fixed by adhering on the surface of the aluminum plate in the thing to be adhered with a roller of 2 kg (one reciprocal movement) as shown in FIG. 3. After the fixing, each sample for evaluation of anti-repulsion property is fixed, placed in a drier set at 60° C. for 72 hours, then the floating state on the side to which adhesion to the surface of the polyimide plate is observed and an anti-repulsion property is evaluated according to the following evaluating criteria. Tested numbers for each of the samples for evaluation of anti-repulsion property (sample for evaluation of anti-repulsion property in the initial stage and sample for evaluation of anti-repulsion property after reflow step) are made 3.

Evaluating Criteria
good: no floating was observed at all
poor: floating was observed FIG. 3 is a rough cross-sectional view showing the adhered state of the double-sided pressure-sensitive adhesive tape or sheet for evaluating the anti-repulsion property in a method for evaluation of anti-repulsion property. In FIG. 3, 6 is a double-sided pressure-sensitive adhesive tape or sheet, 7 is a lining material (a model FPC having the characteristic as shown in Table 2), 8 is a material to be adhered (a layer plate comprising polyimide plate and aluminum plate), 8a is the surface of the polyimide plate side and 8b is the surface of the aluminum plate side. The area surrounded by a dashed line in A is an area where floating is checked.

Method for Evaluation of Processing Property

A release liner where a release treating layer comprising a silicone-type release treating agent is formed on the surface of synthetic paper is adhered onto the pressure-sensitive adhesive side exposed on each of the double-sided pressure-sensitive adhesive tape or sheet to prepare a double-sided pressure-sensitive adhesive tape or sheet of a double separator type. The resulting double-sided pressure-sensitive adhesive tape or sheet of a double separator type is subjected to a half cutting using a pressing machine from the side of a release liner which was already adhered from the initial stage (a release liner where a release treating layer comprising a silicone-type release treatment agent is formed on the surface of a glassine paper) to prepare a sample for evaluation of a processing property. Said sample for evaluation of a processing property is allowed to stand for one week under the atmosphere of 60° C. temperature and 90% relative humidity, the resulting state whether a self-adhesion of the cut surface is observed and a processing property is evaluated according to the following evaluating criteria.

Evaluating Criteria for Processing Property
good: no self-adhesion was noted on the cut surface
poor: self-adhesion was noted on the cut surface

TABLE 1

|  | Gel Fraction (wt %) | | | Adhesive | Anti-repulsion property | | |
| --- | --- | --- | --- | --- | --- | --- | --- |
|  | Initial Stage | After Heating | Gel Fraction Difference | Force (N/20 mm) | Initial Stage | After Heating | Processing Property |
| Ex. 1 | 51 | 56 | 5 | 16 | good | good | good |
| Ex. 2 | 50 | 55 | 5 | 17 | good | good | good |
| Ex. 3 | 55 | 59 | 4 | 15 | good | good | good |
| Ex. 4 | 54 | 57 | 3 | 16 | good | good | good |
| Ex. 5 | 58 | 65 | 7 | 11 | good | good | good |
| Ex. 6 | 64 | 65 | 1 | 12 | good | good | good |
| Ex. 7 | 63 | 67 | 4 | 11 | good | good | good |
| Ex. 8 | 62 | 65 | 3 | 13 | good | good | good |
| Ex. 9 | 62 | 66 | 4 | 13 | good | good | good |
| Ex. 10 | 63 | 64 | 1 | 13 | good | good | good |
| Ex. 11 | 62 | 63 | 1 | 13 | good | good | good |
| Ex. 12 | 50 | 54 | 4 | 13 | good | good | good |
| Ex. 13 | 51 | 55 | 4 | 13 | good | good | good |
| Ex. 14 | 53 | 56 | 3 | 12 | good | good | good |
| C.E. 1 | 85 | 86 | 1 | 9 | poor | poor | good |
| C.E. 2 | 57 | 71 | 14 | 10 | good | poor | good |

C.E.: Comparative Example

TABLE 2

| (Characteristic of Model FPC) | | | | | |
| --- | --- | --- | --- | --- | --- |
|  | Cu | Pl | Cu | Thickness | Reaction Force (10 mm × 10 mm) |
| Double-Sided FPC | 1 oz | 1 mil | 1 oz | 180 µm | about 300 g |

From Table 1, it has been confirmed that the double-sided pressure-sensitive adhesive tape or sheet according to each of the Examples has excellent punching processing property and anti-repulsion property and can be advantageously used as a double-sided pressure-sensitive adhesive tape or sheet to be used for wiring circuit board.

While the present invention has been described in detail and with reference to specific embodiments thereof, it will be apparent to one skilled in the art that various changes and modifications can be made therein without departing from the scope thereof.

This application is based on Japanese patent application No. 2006-108555 filed on Apr. 11, 2006 and Japanese patent application No. 2007-006207 filed Jan. 15, 2007, the entire contents thereof being hereby incorporated by reference.

What is claimed is:

1. A double-sided pressure-sensitive adhesive tape or sheet for wiring circuit board, comprising a pressure-sensitive adhesive layer formed by a pressure-sensitive adhesive composition containing an acrylic polymer and a chain transfer substance, the chain transfer substance being a tackifier resin containing a phenolic hydroxyl group, in a proportion of from 5 to 45 parts by weight with respect to 100 parts by weight of the acrylic polymer,
wherein said pressure-sensitive adhesive layer has characteristics in which a gel fraction in the initial stage is from 40 to 70% by weight, and a difference between a gel fraction after a solder reflow step and the gel fraction in the initial stage is 10 or less, said solder reflow step satisfying the following heat treatment conditions:
(a) a surface temperature of said pressure-sensitive adhesive tape or sheet reaches 175±10° C. within 130 to 180 seconds after start of the solder reflow step for said pressure-sensitive adhesive tape or sheet;
(b) the surface temperature of said pressure-sensitive adhesive tape or sheet reaches 230±10° C. within 200 to 250 seconds after start of the solder reflow step for said pressure-sensitive adhesive tape or sheet;
(c) the surface temperature of said pressure-sensitive adhesive tape or sheet reaches 255±15° C. within 260 to 300 seconds after start of the solder reflow step for said pressure-sensitive adhesive tape or sheet; and
(d) the solder reflow step finishes within 370 seconds after start of the solder reflow step for said pressure-sensitive adhesive tape or sheet.

2. The double-sided pressure-sensitive adhesive tape or sheet according to claim 1, wherein the tackifier resin containing a phenolic hydroxyl group is at least one member selected from the group consisting of a phenol-modified terpene-type tackifier resin, a phenol-modified rosin-type tackifier resin and a phenol-type tackifier resin.

3. The double-sided pressure-sensitive adhesive tape or sheet according to claim 1, which has a thickness from one pressure-sensitive adhesive surface to the other pressure-sensitive adhesive surface of from 20 to 70 µm.

4. A wiring circuit board comprising an electric insulator layer and an electric conductor layer disposed on the electric insulator layer so as to form a predetermined circuit pattern, wherein the double-sided pressure-sensitive adhesive tape or sheet according to claim 1 is adhered on the back side of the wiring circuit board.

5. A double-sided pressure-sensitive adhesive tape or sheet, comprising:
a substrate; and
a plurality of pressure-sensitive adhesive layers disposed on both sides of the substrate,
at least one of said plurality of pressure-sensitive adhesive layers being a pressure-sensitive adhesive layer formed by a pressure-sensitive adhesive composition containing an acrylic polymer and a chain transfer substance the chain transfer substance being a tackifier resin containing a phenolic hydroxyl group, in a proportion of from 5 to 45 parts by weight with respect to 100 parts by weight of the acrylic polymer,
wherein said pressure-sensitive adhesive layer has characteristics in which a gel fraction in the initial stage is from 40 to 70% by weight, and a difference between a gel fraction after a solder reflow step and the gel fraction in the initial stage is 10 or less, said solder reflow step satisfying the following heat treatment conditions:
(a) a surface temperature of said pressure-sensitive adhesive tape or sheet reaches 175±10° C. within 130 to 180 seconds after start of the solder reflow step for said pressure-sensitive adhesive tape or sheet;
(b) the surface temperature of said pressure-sensitive adhesive tape or sheet reaches 230±10° C. within 200 to 250 seconds after start of the solder reflow step for said pressure-sensitive adhesive tape or sheet;
(c) the surface temperature of said pressure-sensitive adhesive tape or sheet reaches 255±15° C. within 260 to 300 seconds after start of the solder reflow step for said pressure-sensitive adhesive tape or sheet; and
(d) the solder reflow step finishes within 370 seconds after start of the solder reflow step for said pressure-sensitive adhesive tape or sheet.

6. The double-sided pressure-sensitive adhesive tape or sheet according to claim 5, wherein the substrate comprises nonwoven fabric.

7. The double-sided pressure-sensitive adhesive tape or sheet according to claim 5, which has a thickness from one pressure-sensitive adhesive surface to the other pressure-sensitive adhesive surface of from 20 to 70 λm.

8. A wiring circuit board comprising an electric insulator layer and an electric conductor layer disposed on the electric insulator layer so as to form a predetermined circuit pattern, wherein the double-sided pressure-sensitive adhesive tape or sheet according to claim 5 is adhered on the back side of the wiring circuit board.

9. The double-sided pressure-sensitive adhesive tape or sheet according to claim 5, wherein the tackifier resin containing a phenolic hydroxyl group is at least one member selected from the group consisting of a phenol-modified terpene-type tackifier resin, a phenol-modified rosin-type tackifier resin and a phenol-type tackifier resin.

* * * * *